(12) United States Patent
Lin et al.

(10) Patent No.: US 11,039,425 B2
(45) Date of Patent: Jun. 15, 2021

(54) POLAR CODES WITH A CROSS-REFERENCEABLE NESTED STRUCTURE FOR HIERARCHICAL SIGNALING

(71) Applicant: QUALCOMM Incorporated, San Diego, CA (US)

(72) Inventors: Jamie Menjay Lin, San Diego, CA (US); Yang Yang, San Diego, CA (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 244 days.

(21) Appl. No.: 16/014,489

(22) Filed: Jun. 21, 2018

(65) Prior Publication Data

US 2018/0376468 A1 Dec. 27, 2018

Related U.S. Application Data

(63) Continuation of application No. 62/524,370, filed on Jun. 23, 2017.

(51) Int. Cl.
*H04W 72/04* (2009.01)
*H04L 1/00* (2006.01)
(Continued)

(52) U.S. Cl.
CPC ....... *H04W 72/0406* (2013.01); *H03M 13/13* (2013.01); *H04L 1/0057* (2013.01);
(Continued)

(58) Field of Classification Search
CPC ............ H04W 72/0406; H04W 72/046; H04L 1/0064; H04L 1/0067; H04L 1/0061;
(Continued)

(56) References Cited

U.S. PATENT DOCUMENTS

2011/0044282 A1* 2/2011 Seo .................. H04L 5/0053
370/329
2011/0222491 A1 9/2011 Vajapeyam et al.
(Continued)

OTHER PUBLICATIONS

International Search Report and Written Opinion—PCT/US2018/039078—ISA/EPO—Oct. 5, 2018 (174848WO).
(Continued)

*Primary Examiner* — Charles C Jiang
*Assistant Examiner* — Voster Preval
(74) *Attorney, Agent, or Firm* — Linda G. Gunderson; Holland & Hart LLP

(57) ABSTRACT

Methods, systems, and devices for wireless communication employing polar code techniques are described. In some examples, polar codes with a cross-referenceable nested structure for hierarchical signaling may be used in a wireless communication system. For example, a user equipment may monitor a common portion and a dedicated portion of a control channel, the common portion assigned to a first set of control channel resources and the dedicated portion assigned to a second set of control channel resources within the control channel. The UE may concatenate, based at least in part on the monitoring, information fields of one or more symbols received via the first and second sets of control channel resources to form a polar-encoded codeword. The UE may decode the polar-encoded codeword to obtain common information from the common portion and dedicated information from the dedicated portion.

40 Claims, 20 Drawing Sheets

(51) Int. Cl.
 *H03M 13/13* (2006.01)
 *H04L 5/00* (2006.01)

(52) U.S. Cl.
 CPC .......... *H04L 1/0061* (2013.01); *H04L 1/0064* (2013.01); *H04L 1/0067* (2013.01); *H04L 1/0072* (2013.01); *H04L 5/001* (2013.01); *H04L 5/0053* (2013.01)

(58) Field of Classification Search
 CPC ... H04L 1/0057; H04L 1/0072; H04L 5/0053; H04L 5/001; H03M 13/13
 See application file for complete search history.

(56) References Cited

U.S. PATENT DOCUMENTS

| | | | |
|---|---|---|---|
| 2017/0013506 A1 | 1/2017 | Chen et al. | |
| 2017/0214416 A1* | 7/2017 | Ge | H03M 13/13 |
| 2018/0167946 A1* | 6/2018 | Si | H04L 5/00 |
| 2019/0103883 A1* | 4/2019 | Ye | H04L 1/0042 |
| 2019/0305874 A1 | 10/2019 | Ahn et al. | |
| 2019/0335431 A1* | 10/2019 | Wang | H04W 72/12 |
| 2019/0379486 A1* | 12/2019 | Hwang | H04L 1/0041 |
| 2020/0067531 A1* | 2/2020 | Chen | H03M 13/6318 |
| 2020/0092039 A1* | 3/2020 | Wang | H04L 1/0036 |

OTHER PUBLICATIONS

Mediatek Inc: "Polar Coding Design for NR-PBCH Combining", 3GPP Draft; R1-1710826_Polar Coding Design for NR-PBCH Combining, 3rd Generation Partnership Project (3GPP), Mobile Competence Centre; 650, Route Des Lucioles; F-06921 Sophia-Antipolis Cedex; France, vol. RAN WG1, No. Qingdao, China; Jun. 27, 2017-Jun. 30, 2017 Jun. 20, 2017, XP051305775, Retrieved from the Internet: URL:http://www.3gpp.org/ftp/tsg_ran/WG1_RL1/TSGR1_AH/NR_AH_1706/Docs/ [retrieved on Jun. 20, 2017], 5 pages.

Qualcomm Incorporated: "PBCH Design using Polar codes", 3GPP Draft; R1-1716448 PBCH Design Using Polar Codes, 3rd Generation Partnership Project (3GPP), Mobile Competence Centre; 650, Route Des Lucioles; F-06921 Sophia-Antipolis Cedex; France, vol. RAN WG1, No. Nagoya, Japan; Sep. 18, 2017-Sep. 21, 2017 Sep. 12, 2017, XP051330037, Retrieved from the Internet: URL:http://www.3gpp.org/ftp/tsg_ran/WG1_RL1/TSGR1_AH/NR_AH_1709/Docs/ [retrieved on Sep. 12, 2017], 8 pages.

* cited by examiner

POLAR CODES WITH A CROSS-REFERENCEABLE NESTED STRUCTURE FOR HIERARCHICAL SIGNALING

CROSS REFERENCES

The present Application for patent claims the benefit of U.S. Provisional Patent Application No. 62/524,370 by LIN, et al., entitled "POLAR CODES WITH A CROSS-REFERENCEABLE NESTED STRUCTURE FOR HIERARCHICAL SIGNALING," filed Jun. 23, 2017, assigned to the assignee hereof, and expressly incorporated by reference herein.

BACKGROUND

The following relates generally to wireless communication, and more specifically to polar codes with a cross-referenceable nested structure for hierarchical signaling.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Code blocks may be encoded by a transmitting device (e.g., a base station or UE) using an encoding algorithm. Error correcting codes may be used to introduce redundancy in a code block so that transmission errors may be detected and corrected. Some examples of encoding algorithms with error correcting codes include convolutional codes (CCs), low-density parity-check (LDPC) codes, and polar codes. A polar code is an example of a linear block error correcting code and has been shown to asymptotically approach the theoretical channel capacity as the code length increases. Conventional polar coding techniques are deficient for certain types of communications.

SUMMARY

The described techniques relate to improved methods, systems, devices, or apparatuses that support polar codes with a cross-referenceable nested structure for hierarchical signaling. The examples described herein provide for generation of a polar codeword having a nested structure enabling transmission of control information that is shareable by multiple UEs and dedicated information that is UE-specific. The control information may also be jointly encoded with dedicated information to improve a false alarm rate.

In some examples, a base station may polar encode common information and dedicated information to form a polar-encoded codeword. The base station may map a first set of bits of the polar-encoded codeword to a first set of control channel resources of a control channel and a second set of bits of the polar-encoded codeword to a second set of control channel resources of the control channel. The base station may transmit the polar-encoded codeword within the control channel using the first and second sets of control channel resources. A UE may monitor a common portion and a dedicated portion of the control channel, the common portion assigned to the first set of control channel resources and the dedicated portion assigned to the second set of control channel resources. The UE may concatenate, based at least in part on the monitoring, information fields of one or more symbols received via the first and second sets of control channel resources to form a polar-encoded codeword. The UE may decode the polar-encoded codeword to obtain common information from the common portion and dedicated information from the dedicated portion.

A method of wireless communication is described. The method may include monitoring a common portion and a dedicated portion of a control channel, the common portion assigned to a first set of control channel resources and the dedicated portion assigned to a second set of control channel resources within the control channel, concatenating, based at least in part on the monitoring, information fields of one or more symbols received via the first and second sets of control channel resources to form a polar encoded codeword, and decoding the polar encoded codeword to obtain common information from the common portion and dedicated information from the dedicated portion.

An apparatus for wireless communication is described. The apparatus may include means for monitoring a common portion and a dedicated portion of a control channel, the common portion assigned to a first set of control channel resources and the dedicated portion assigned to a second set of control channel resources within the control channel, means for concatenating, based at least in part on the monitoring, information fields of one or more symbols received via the first and second sets of control channel resources to form a polar encoded codeword, and means for decoding the polar encoded codeword to obtain common information from the common portion and dedicated information from the dedicated portion.

Another apparatus for wireless communication is described. The apparatus may include a processor, memory in electronic communication with the processor, and instructions stored in the memory. The instructions may be operable to cause the processor to monitor a common portion and a dedicated portion of a control channel, the common portion assigned to a first set of control channel resources and the dedicated portion assigned to a second set of control channel resources within the control channel, concatenate, based at least in part on the monitoring, information fields of one or more symbols received via the first and second sets of control channel resources to form a polar encoded codeword, and decode the polar encoded codeword to obtain common information from the common portion and dedicated information from the dedicated portion.

A non-transitory computer readable medium for wireless communication is described. The non-transitory computer-readable medium may include instructions operable to cause a processor to monitor a common portion and a dedicated portion of a control channel, the common portion assigned to a first set of control channel resources and the dedicated portion assigned to a second set of control channel resources within the control channel, concatenate, based at least in part on the monitoring, information fields of one or more symbols received via the first and second sets of control channel resources to form a polar encoded codeword, and decode the polar encoded codeword to obtain common information from the common portion and dedicated information from the dedicated portion.

In some examples of the method, apparatus, and non-transitory computer-readable medium described above, decoding the polar encoded codeword comprises: determining a set of aggregation levels, wherein concatenating the information fields of one or more symbols received via the first and second sets of control channel resources to form a polar encoded codeword corresponds to a first aggregation level within the set of aggregation levels.

In some examples of the method, apparatus, and non-transitory computer-readable medium described above, each of the aggregation levels includes a same number of bits for the common information and the same or a different number of bits for the dedicated information.

In some examples of the method, apparatus, and non-transitory computer-readable medium described above, monitoring a group portion of the control channel, the group portion assigned to a third set of control channel resources within the control channel, wherein the concatenating comprises: concatenating information fields of one or more symbols received via the first, second, and third sets of control channel resources to form the polar encoded codeword, wherein decoding of the polar encoded codeword comprises: decoding the polar encoded codeword to obtain the group information from the group portion.

In some examples of the method, apparatus, and non-transitory computer-readable medium described above, concatenating the information fields of one or more symbols received via the first and second sets of control channel resources to form the polar encoded codeword comprises: performing de-rate matching to form the polar encoded codeword.

In some examples of the method, apparatus, and non-transitory computer-readable medium described above, decoding the polar encoded codeword comprises: obtaining at least one error detection code (EDC) value from the polar encoded codeword. Some examples of the method, apparatus, and non-transitory computer-readable medium described above may further include processes, features, means, or instructions for determining whether the common information, the dedicated information, or both, pass error detection based at least in part on the at least one EDC value. In some examples of the method, apparatus, and non-transitory computer-readable medium described above, the at least one EDC value may be in the dedicated information.

In some examples of the method, apparatus, and non-transitory computer-readable medium described above, the polar encoded codeword may be generated by an encoder comprising a plurality of encoding branches, wherein the plurality of encoding branches may be divided into at least a first encoding branch subset and a second encoding branch subset, outputs of the first encoding branch subset being independent of inputs to the second encoding branch subset, and wherein the encoder encodes the common information using the first encoding branch subset and the dedicated information using the second encoding branch sub set.

In some examples of the method, apparatus, and non-transitory computer-readable medium described above, the common information may be control information for a plurality of user equipments (UEs) that includes the UE. In some examples of the method, apparatus, and non-transitory computer-readable medium described above, the dedicated information may be control information specific to the UE. In some examples of the method, apparatus, and non-transitory computer-readable medium described above, each of the first and second sets of control channel resources may be a different set of sub-carriers of the control channel.

A method of wireless communication is described. The method may include polar encoding common information and dedicated information to form a polar-encoded codeword, mapping a first set of bits of the polar-encoded codeword to a first set of control channel resources of a control channel and a second set of bits of the polar-encoded codeword to a second set of control channel resources of the control channel, and transmitting the polar-encoded codeword within the control channel using the first and second sets of control channel resources.

An apparatus for wireless communication is described. The apparatus may include means for polar encoding common information and dedicated information to form a polar-encoded codeword, means for mapping a first set of bits of the polar-encoded codeword to a first set of control channel resources of a control channel and a second set of bits of the polar-encoded codeword to a second set of control channel resources of the control channel, and means for transmitting the polar-encoded codeword within the control channel using the first and second sets of control channel resources.

Another apparatus for wireless communication is described. The apparatus may include a processor, memory in electronic communication with the processor, and instructions stored in the memory. The instructions may be operable to cause the processor to polar encoding common information and dedicated information to form a polar-encoded codeword, map a first set of bits of the polar-encoded codeword to a first set of control channel resources of a control channel and a second set of bits of the polar-encoded codeword to a second set of control channel resources of the control channel, and transmit the polar-encoded codeword within the control channel using the first and second sets of control channel resources.

A non-transitory computer readable medium for wireless communication is described. The non-transitory computer-readable medium may include instructions operable to cause a processor to polar encoding common information and dedicated information to form a polar-encoded codeword, map a first set of bits of the polar-encoded codeword to a first set of control channel resources of a control channel and a second set of bits of the polar-encoded codeword to a second set of control channel resources of the control channel, and transmit the polar-encoded codeword within the control channel using the first and second sets of control channel resources.

Some examples of the method, apparatus, and non-transitory computer-readable medium described above may further include processes, features, means, or instructions for polar encoding the common information and second dedicated information to form a second polar-encoded codeword, wherein the dedicated information may be specific to a first UE, the second dedicated information may be specific to a second UE, and the common information may be common to the first and second UEs. Some examples of the method, apparatus, and non-transitory computer-readable medium described above may further include processes, features, means, or instructions for mapping a first set of bits of the second polar-encoded codeword to the first set of control channel resources of the control channel and a second set of bits of the second polar-encoded codeword to a third set of control channel resources of the control channel. Some examples of the method, apparatus, and non-transitory computer-readable medium described above may further include processes, features, means, or instructions for transmitting the second polar-encoded codeword within the control channel using the first and third sets of control channel resources within the same transmission time interval that the polar-encoded codeword may be transmitted.

Some examples of the method, apparatus, and non-transitory computer-readable medium described above may further include processes, features, means, or instructions for generating at least one EDC value based at least in part on the common information, the dedicated information, or both, wherein the polar encoding comprises polar encoding the common information, the dedicated information, and the at least one EDC value to form the polar-encoded codeword.

Some examples of the method, apparatus, and non-transitory computer-readable medium described above may further include processes, features, means, or instructions for selecting an aggregation level from a plurality of aggregation levels, wherein the mapping of the second set of bits of the polar-encoded codeword to the second set of control channel resources of the control channel may be based at least in part on the selected aggregation level.

Some examples of the method, apparatus, and non-transitory computer-readable medium described above may further include processes, features, means, or instructions for determining a power level for the first set of bits of the polar-encoded codeword based at least in part on the selected aggregation level, wherein the transmitting of the polar-encoded codeword within the control channel may be based at least in part on the determined power level.

In some examples of the method, apparatus, and non-transitory computer-readable medium described above, the polar encoding comprises: polar encoding the common information, the dedicated information, and group information to form the polar-encoded codeword, wherein the mapping further comprises: mapping a third set of bits of the polar-encoded codeword to a third set of control channel resources within the control channel, wherein the transmitting further comprises: transmitting the polar-encoded codeword within the control channel using the first, second, and third sets of control channel resources.

Some examples of the method, apparatus, and non-transitory computer-readable medium described above may further include processes, features, means, or instructions for performing rate matching on the polar-encoded codeword to generate a rate-matched polar-encoded codeword, wherein the transmitting comprises transmitting the rate-matched polar-encoded codeword.

In some examples of the method, apparatus, and non-transitory computer-readable medium described above, the polar encoding may be performed by an encoder comprising a plurality of encoding branches, wherein the plurality of encoding branches may be divided into at least a first encoding branch subset and a second encoding branch subset, outputs of the first encoding branch subset being independent of inputs to the second encoding branch subset, and wherein the encoder encodes the common information using the first encoding branch subset and the dedicated information using the second encoding branch subset.

In some examples of the method, apparatus, and non-transitory computer-readable medium described above, each of the first and second sets of control channel resources may be a different set of sub-carriers within the control channel.

DETAILED DESCRIPTION

The techniques described herein relate to polar codes with a cross-referenceable nested structure for hierarchical signaling. In some examples, a base station may polar encode common information and dedicated information to form a polar-encoded codeword. The base station may map a first set of bits of the polar-encoded codeword to a first set of control channel resources of a control channel and a second set of bits of the polar-encoded codeword to a second set of control channel resources of the control channel. The base station may transmit the polar-encoded codeword within the control channel using the first and second sets of control channel resources. A UE may monitor a common portion and a dedicated portion of the control channel, the common portion assigned to the first set of control channel resources and the dedicated portion assigned to the second set of control channel resources. The UE may concatenate, based at least in part on the monitoring, information fields of one or more symbols received via the first and second sets of control channel resources to form a polar-encoded codeword. The UE may decode the polar-encoded codeword to obtain common information from the common portion and dedicated information from the dedicated portion.

The examples described herein provide for generation of a polar codeword having a nested structure enabling transmission of common information that is shareable by multiple UEs and dedicated information that is UE-specific. The common information may also be jointly encoded with the dedicated information to improve a false alarm rate (FAR).

A FAR occurs when a UE determines that a decoded signal includes information, when no such signal was sent or the information is for a different UE.

Aspects of the disclosure are initially described in the context of a wireless communications system. The wireless communications system may generate a polar codeword having a nested structure enabling transmission of common information that is shareable by multiple UEs and dedicated information that is UE-specific. Aspects of the disclosure are further illustrated by and described with reference to apparatus diagrams, system diagrams, and flowcharts that relate to polar code techniques.

Figure 1:
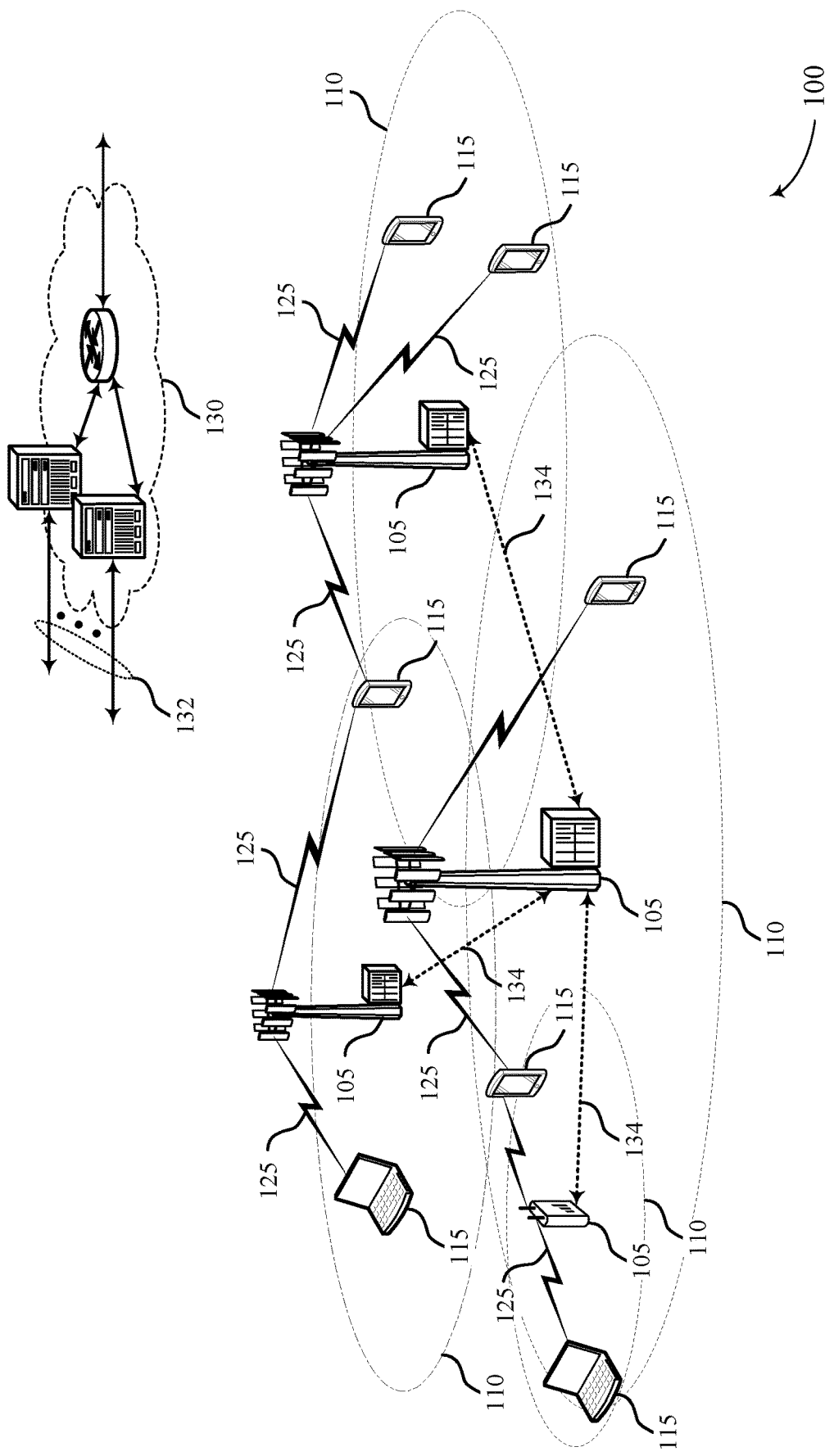
FIG. 1 illustrates an example of a system for wireless communication that supports polar code techniques in accordance with aspects of the present disclosure.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a 5th Generation (5G)/New Radio (NR) or long term evolution (LTE) (or LTE-Advanced (LTE-A)) network. In some aspects, wireless communications system 100 may support enhanced broadband communications, ultra-reliable (i.e., mission critical) communications, low latency communications, and communications with low-cost and low-complexity devices.

In some examples, base station 105 may polar encode common information and dedicated information to form a polar-encoded codeword, and map a first set of bits of the polar-encoded codeword (e.g., a first information field $Y_c$ comprising one or more bits) to a first set of control channel resources of a control channel and a second set of bits of the polar-encoded codeword (e.g., a second information field $Y_d$ comprising one or more bits), to a second set of control channel resources of the control channel. The base station 105 may transmit the polar-encoded codeword within the control channel using the first and second sets of control channel resources. A UE 115 may monitor a common portion and a dedicated portion of the control channel, the common portion assigned to the first set of control channel resources and the dedicated portion assigned to the second set of control channel resources within the control channel. The UE 115 may concatenate, based at least in part on the monitoring, information fields of one or more symbols received via the first and second sets of control channel resources to form a polar-encoded codeword. The UE 115 may decode the polar-encoded codeword to obtain common information from the common portion and dedicated information from the dedicated portion Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some aspects, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some aspects, groups of UEs 115 communicating via D2D communications may utilize a one-to-many (1:M) system in which each UE 115 transmits to every other UE 115 in the group. In some aspects, a base station 105 facilitates the scheduling of resources for D2D communications. In other aspects, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some aspects, an MTC device may operate using half-duplex (one-way) communications at a reduced peak rate. MTC devices may also be configured to enter a power saving "deep sleep" mode when not engaging in active communications. In some aspects, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC) that may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW that may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity that may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some aspects, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some aspects, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some aspects, the antennas of a base station 105 or UE 115 may be located within one or more antenna arrays that may support beamforming or MIMO operation. One or more base station antennas or antenna arrays may be collocated at an antenna assembly, such as an antenna tower. In some aspects, antennas or antenna arrays associated with a base station 105 may be located in diverse geographic locations. A base station 105 may multiple use antennas or antenna arrays to conduct beamforming operations for directional communications with a UE 115.

In some aspects, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some aspects perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and a network device, base station 105, or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s=1/30{,}720{,}000$ seconds). Time resources may be organized according to radio frames of length of 10 ms ($T_f=307200T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some aspects the subframe may be the smallest scheduling unit, also known as a TTI. In other aspects, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

In some aspects, wireless communications system 100 may utilize enhanced component carriers (eCCs). An eCC may be characterized by one or more features including: wider bandwidth, shorter symbol duration, shorter TTIs, and modified control channel configuration. In some aspects, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some aspects, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some aspects, the TTI duration (that is, the number of symbols in a TTI) may be variable.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some aspects, wireless communications system 100 may utilize both licensed and unlicensed radio frequency spectrum bands. For example, wireless communications system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some aspects, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

Conventional hierarchical control information signaling is deficient, and may suffer from inferior code performance, inferior code efficiency, or the like. The examples described herein provide for generation of a polar codeword having a nested structure enabling transmission of control information that is shareable by multiple UEs and dedicated information that is UE-specific. The control information may also be jointly encoded with dedicated information to improve a false alarm rate.

Figure 2:
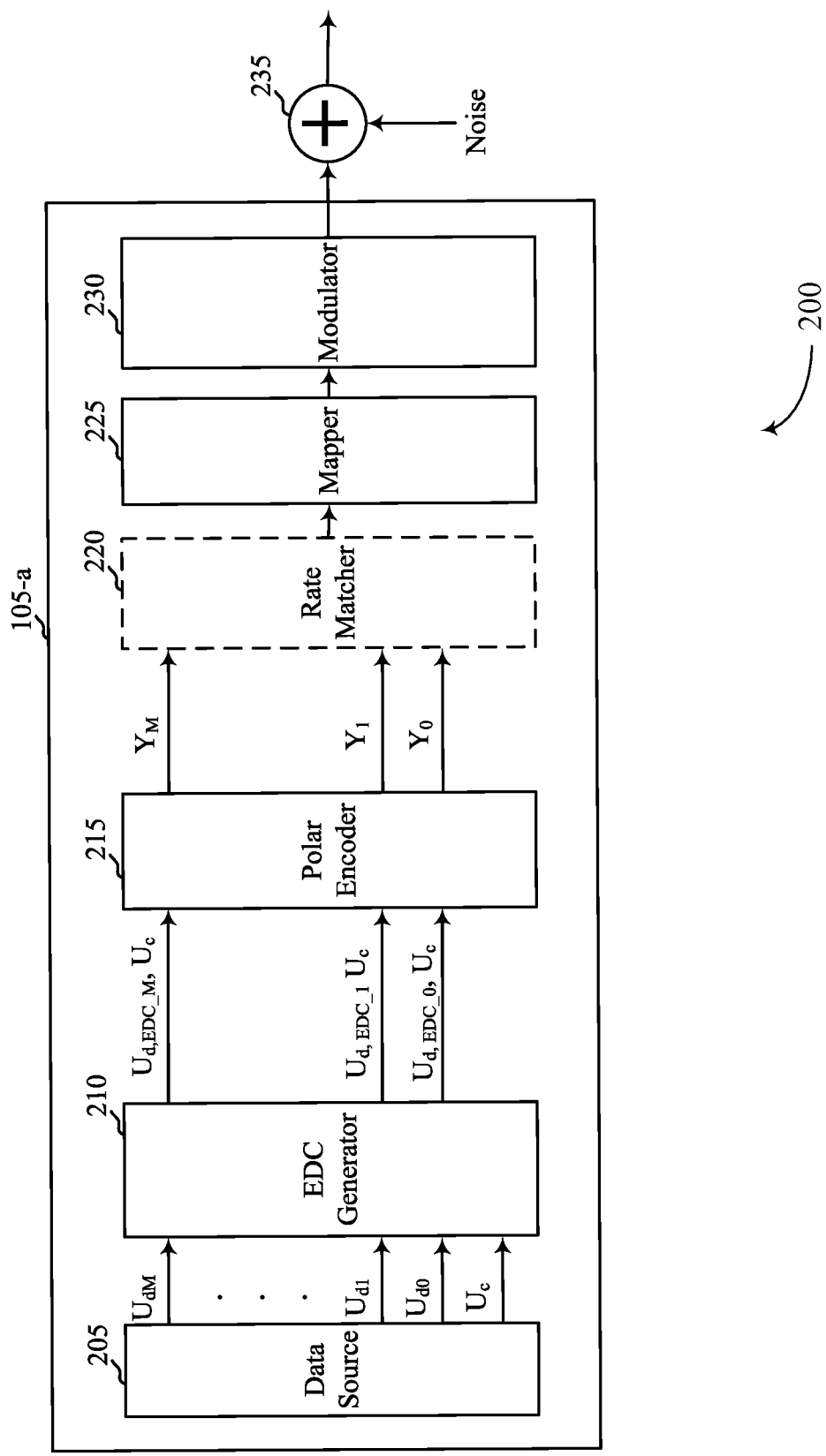
FIG. 2 illustrates an example of a transmitter that supports polar code techniques in accordance with aspects of the present disclosure.

FIG. 2 illustrates an example diagram 200 of a transmitter that supports polar code techniques in accordance with various aspects of the present disclosure. In some examples, base station 105-$a$ is an example of a transmitter and may implement aspects of wireless communications system 100.

Base station 105-$a$ may generate information and polar encode an information vector that includes the information into a codeword that is transmitted to UE 115-$a$ (see FIG. 6), to a different base station, or to another device, via a wireless communication channel 235. In some examples, the information may be control information (e.g., downlink control information (DCI)). The information may include common control information $U_c$ that is common to a set of UEs, and dedicated control information $U_d$ that is intended for a specific UE. The techniques described herein may generate a set of polar-encoded codewords Y having a cross-referenceable structure, where each codeword Y is generated based on the same common control information and based on dedicated control information that is specific to each UE. Devices other than base station 105-$a$ and UE 115-$a$ may use the techniques described herein.

In some examples, the polar-encoded codewords Y may be defined as follows:

Codeword $Y_0$ (for UE0) $\{Y_{c0}, Y_{d0}\}$
Codeword $Y_1$ (for UE1): $\{Y_{c1}, Y_{d1}\}$ It is noted that this is a simplified example including two codewords Y, and the principles described herein may be extended to any number of codewords. By using the polar coding techniques described herein, $Y_c$ for a given codeword depends on common information $U_c$, and $Y_d$ of the codeword depends on both the common information $U_c$ and dedicated information $U_d$. For the codewords $Y_0$ and $Y_1$ discussed above, $Y_{d0}$ depends on $U_{c0}$ and $U_{d0}$, $Y_{d1}$ depends on $U_{c1}$ and $U_{d1}$, and both $Y_{c0}$ and $Y_{c1}$ do not depend on either of $U_{d0}$ or $U_{d1}$. Thus, the $Y_c$ portions of codewords $Y_0$, $Y_1$ depend on the identical subset of information bits $U_c$. If $U_{c0}=U_{c1}$, then $Y_{c0}=Y_{c1}=Y_c$, and the two Polar codewords $Y_0$, $Y_1$ may be rewritten as follows:

Codeword $Y_0$ (for UE0): $\{Y_c, Y_{d0}\}$
Codeword $Y_1$ (for UE1): $\{Y_c, Y_{d1}\}$ Codewords $Y_0$, $Y_1$ have a common codeword portion $Y_c$ and thus a cross-referenceable structure. Control signaling may utilize multiple applications of this cross-referenceable structure. For example, $Y_c$ may be sharable among multiple users and therefore may carry the common control information (e.g., $U_c$) applicable to multiple users.

As described herein, each UE may retrieve the sharable $Y_c$ portion (e.g., a first information field comprising one or more bits) from a control channel and concatenate $Y_c$ with the dedicated portion $Y_d$ (e.g., a second information field comprising one or more bits) that is specific to a particular UE (e.g., $Y_{d0}$ for UE0, $Y_{d1}$ for UE1) to form a polar codeword for decoding. Also described herein, the base station 105-a may generate an EDC value that is a function of $U_c$ and $U_d$, and include the EDC value with $U_d$ to form $U_{d, EDC}$. The EDC value may provide error protection to each of the control information and the dedicated information, and thereby improve a detection rate and a false alarm rate. The cross-referenceable structure also provides opportunities for error detection of both the common information and the dedicated information. The EDC value may be a function of $U_c$ and $U_d$, enabling checking of both the common control information and the dedicated control information. Further, since $U_c$ carried by $Y_c$ is sharable, the EDC value of each codeword Y may be included in the dedicated portion $U_d$ (e.g., $U_{d0}$ contains CRC0, $U_{d1}$ contains CRC1). Thus, the techniques described herein may improve a detection rate and reduce a false alarm rate. Also described herein, in some examples, a bit length of $U_d$ may be the same for two or more UEs, or may differ for at least two UEs.

In the depicted example, base station 105-a may include a data source 205, an EDC generator 210, a polar encoder 215, a rate matcher 220, a mapper 225, and a modulator 230. The data source 205 may provide information U (e.g., DCI) to be encoded and transmitted to a set of one or more UEs. The data source 205 may be coupled to a network, a storage device, or the like. The information U may include dedicated information $U_d$ and common information $U_c$. The dedicated information $U_d$ may be control information intended for a specific UE, and the common information $U_c$ may be control information intended for a set of UEs. The common information $U_c$ may include, for example, a physical control channel format indicator (e.g., indicator of a number of symbols used for control information), system information, paging, physical random access channel responses, or uplink transmit power control (TPC) commands. The dedicated information may include, for example, DCI related to uplink and downlink grants or other UE-specific information.

In some instances, time resources may be divided into transmission time interval (TTIs), and the base station 105-a and one or more UEs 115 may communicate within the TTIs. Each TTI may include a control channel and a data channel. The base station 105-a may generate a set of polar-encoded codewords based on the dedicated information $U_d$ for multiple UEs and the common information $U_c$, and transmit the polar-encoded codewords within the control channel during a particular TTI.

The UEs 115 may monitor the control channel for the dedicated information $U_d$ and the common information $U_c$. The dedicated information $U_d$ may, for example, include a grant that allocates at least a portion of the data channel of a particular TTI to one of the UEs 115 to receive downlink data from that base station 105-a or to transmit uplink data to the base station 105-a. The data source 205 may output common information $U_c$ and dedicated information $U_d$ for a set of M+1 UEs. As depicted, dedicated information $U_{d0}$ is intended for UE0, dedicated information $U_{d1}$ is intended for UE1, and so forth.

The EDC generator 210 may apply an error detecting algorithm to the common information $U_c$, the dedicated information $U_d$, or both, for a particular UE to generate an EDC value. In some aspects, the EDC generator 210 may generate an EDC value for each combination of common information $U_c$ and the dedicated information $U_d$. The EDC value may be a sequence of one or more bits to enable a UE 115 to detect an error in transmission due to, for example, corruption caused by noise in a wireless communication channel 235. In an example, the EDC algorithm may be a CRC algorithm (e.g., linear feedback shift register (LFSR), polynomial division, etc.) and the EDC value may be a CRC value. In another example, the EDC value may be a parity check value generated based on a cyclic shift or number of ones (or zeros) in the common information $U_c$, the dedicated information $U_d$, or both. In some examples, the EDC generator 210 generate the EDC value, or a separate EDC value, based on the common information $U_c$, but not the dedicated information $U_d$. In some examples, the EDC generator 210 generate the EDC value, or a separate EDC value, based on the dedicated information $U_d$, but not the common information $U_c$.

In an example, for UE0, the EDC generator 210 may apply an error detecting algorithm to the common information $U_c$ and the dedicated information $U_{d0}$ for UE0 to generate an EDC value $EDC_0$. For UE1, the EDC generator 210 may apply an error detecting algorithm to the common information $U_c$ and the dedicated information $U_{d1}$ for UE1 to generate an EDC value $EDC_1$. The EDC generator 210 may similarly generate EDC values for another UE in the set of M+1 UEs.

The EDC generator 210 may generate an information vector (e.g., information for multiple fields Y) for each combination of common information $U_c$, dedicated information $U_d$, and corresponding one or more EDC values. For example, the information vector for UE0 may include the common information $U_c$, the dedicated information $U_{d0}$, and EDC value EDC_0. The information vector for UE1 may include the common information $U_c$, the dedicated information $U_{d1}$, and EDC value EDC_1. The EDC generator 210 may similarly generate information vectors for another UE in the set of M+1 UEs. The EDC generator 210 may output the M+1 information vectors to the polar encoder 215.

Figure 3:
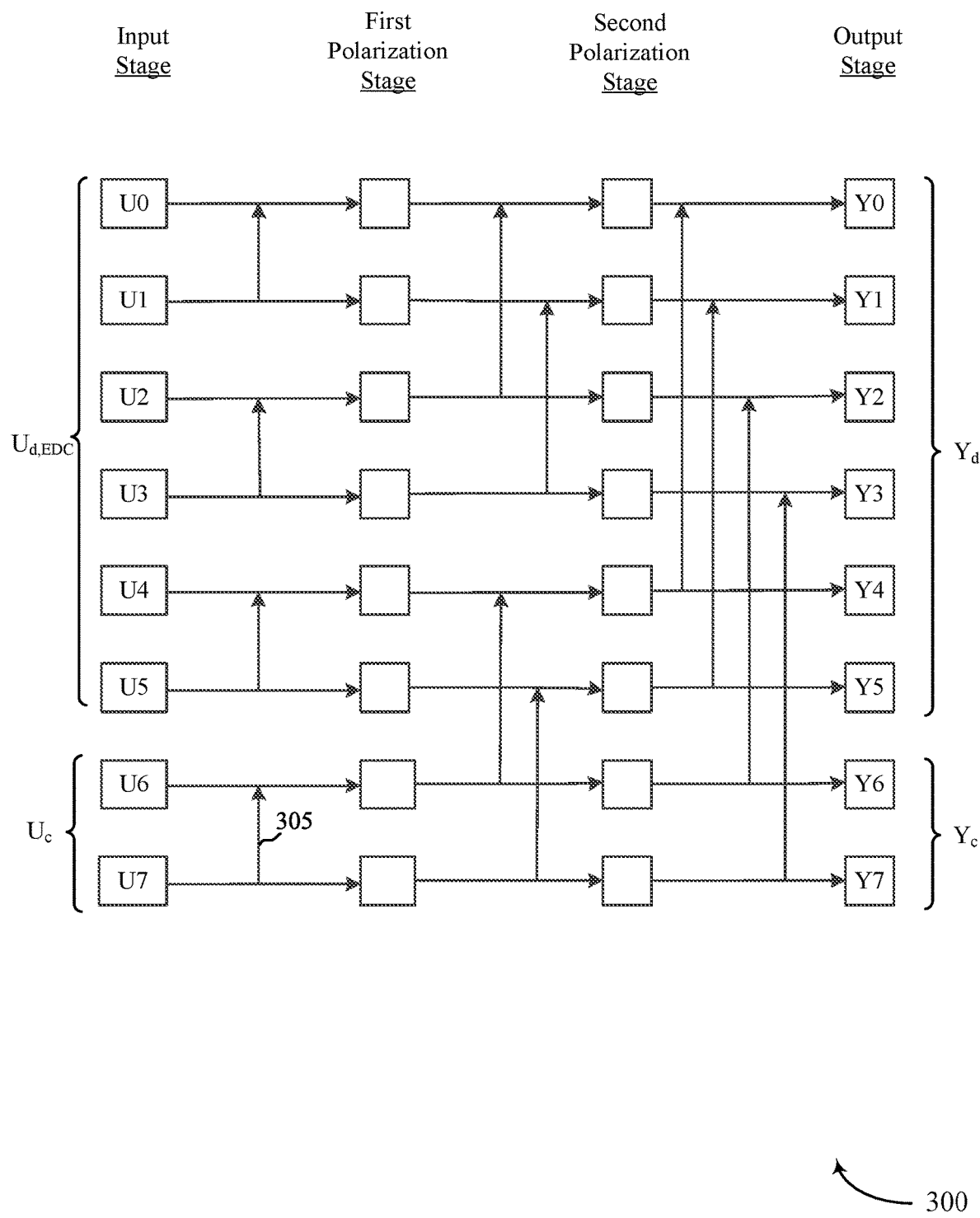
FIG. 3 illustrates an example of a first polar coding scheme that supports polar code techniques in accordance with aspects of the present disclosure.
Figure 4:
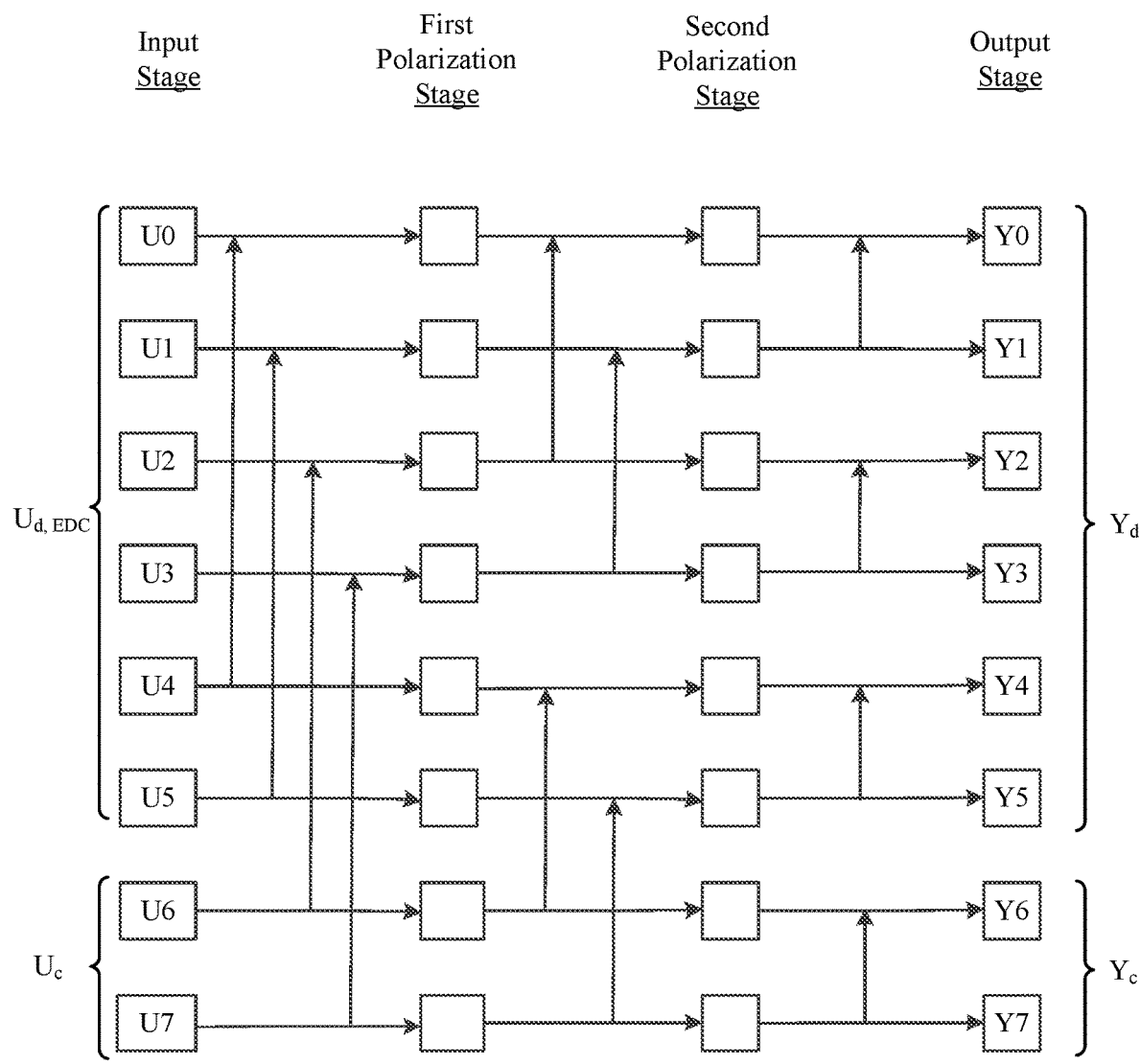
FIG. 4 illustrates an example of a second polar coding scheme that supports polar code techniques in accordance with aspects of the present disclosure.

The polar encoder 215 may polar encode each of the M+1 information vectors to generate M+1 polar-encoded codewords Y. FIG. 3 illustrates an example diagram 300 of a first polar coding scheme, and FIG. 4 illustrates an example diagram 400 of second polar coding scheme that supports polar code techniques in accordance with various aspects of the present disclosure. The polar encoder 215 may apply polar coding scheme 300 or 400, or other polar coding scheme having similar properties, to respectively polar encode each of the M+1 information vectors.

As depicted, each of the polar coding schemes 300, 400 may include a defined number of encoding branches. Depicted are branches 0 to 7, but the polar coding schemes 300, 400 may include any number of encoding branches. Bits of an information vector may be loaded into the input stage shown on the left, and polar-encoded bits may be output from the output stage on the right. In the depicted example, an information vector U includes 8 bits and is composed of $U_c$ and $U_{d,EDC}$ and a codeword Y output at the output stage on the right also includes 8 bits. In each of the polar coding schemes 300, 400, a bit U is input at the input stage at each of branches 0 to 7 (e.g., U0, U1, . . . , U7), and a polar-encoded codeword Y may be formed by the polar-encoded bits output by the branches 0 to 7 (e.g., Y0, Y1, . . . , Y7).

In the depicted examples, bits loaded into the higher number branches are less dependent on bits loaded into lower number branches. As seen from the direction of the arrows on the encoding branches in the polar coding schemes 300, 400, a bit loaded at encoding branch 7 is independent of any of the bits loaded into any other branch. The bit loaded at branch 6 depends on the bit loaded at branch 7 (as shown by directional encoding branch 305 in FIG. 3) and no other bits. As can be seen by continuing toward the lower number branches, the bits loaded into the lower number branches are generally more dependent on bits loaded into higher number branches. By encoding with respect to a single direction corresponding to the number of encoding branches (e.g., from higher number branches like branch 7 and branch 6 to lower number branches like branch 3 and branch 2, but not from lower number branches to higher number branches as depiction in the polar coding schemes 300, 400), a nested signaling structure for grouping various information fields may be employed.

The techniques described herein may exploit this branch dependency when polar encoding common and dedicated information. As noted above, common information may be the same information being sent to multiple UEs. The polar encoder 215 may load bits of the common information into branches that are less dependent on other branches. For example, a first bit of the common information $U_c$ may be loaded into branch 7, and a second bit of the common information $U_c$ may be loaded into branch 6. The polar encoder 215 may load bits dedicated information $U_d$ and bits of the EDC value into other branches. For example, a first bit of the dedicated information $U_d$ may be loaded into branch 5, a second bit of the dedicated information $U_d$ may be loaded into branch 4, a third bit of the dedicated information $U_d$ may be loaded into branch 3, and a fourth bit of the dedicated information $U_d$ may be loaded into branch 2. A first bit of the EDC value may be loaded into branch 1, and a second bit of the EDC value may be loaded into branch 0. The polar-encoded codeword Y may include two parts, $Y_c$ and $Y_d$. As can be seen, the polar-encoded bits $Y_c$, output from branches 6 and 7, are independent of the bits loaded into branches 0 to 5. Thus, even though the dedicated information and the EDC value may vary from UE to UE, the polar-encoded bits $Y_c$ are the same in each codeword Y. The base station 105-$a$ may exploit this fact when mapping codewords $Y_0$ to $Y_M$ to conserve control channel resources.

The polar encoder 215 may thus apply either of the polar coding schemes 300, 400, to generate a set of polar-encoded codewords $Y_0$ to $Y_{M+1}$. Codeword $Y_0$ is based on common information $U_c$, dedicated information $U_{d0}$ for UE0, and the EDC value generated based on $U_c$ and $U_{d0}$. Codeword $Y_1$ is based on common information $U_c$, dedicated information $U_{d1}$ for UE1, and the EDC value generated based on $U_c$ and $U_{d1}$, and so forth for the remaining codewords in the set.

With reference to FIG. 2, the polar encoder 215 may output the M+1 codewords to the rate matcher 220. The rate matcher 220 is shown in dashed lines in FIG. 2 to indicate that rate matching is optional and may be skipped. The rate matcher 220 may perform rate matching on the M+1 polar-encoded codewords Y received from the polar encoder 215. Rate matching may involve selecting some bits of a codeword for transmission in a particular TTI. For example, each of the M+1 polar-encoded codewords may include T bits, where T is a positive integer. The rate matcher 220 may puncture some of the T bits of the polar-encoded codeword and output S of the T bits for transmission, where S is a positive integer that is less than T. In some aspects, the rate matcher 220 may repeat one or more bits of the T bits of the polar-encoded codeword to generate and output V bits for transmission, where V is greater than T. The rate matcher 220 may apply the same rate matching to each of the M+1 codewords, may apply different rate matching to one or more subsets of the M+1 codewords, may apply rate matching to some, but not all of the M+1 codewords, or any combination thereof. The rate matcher 220 may output a set of M+1 rate-matched polar-encoded codewords to the mapper 225. If rate matching is not applied, the polar encoder 215 may output the M+1 codewords to the mapper 225.

Figure 5:
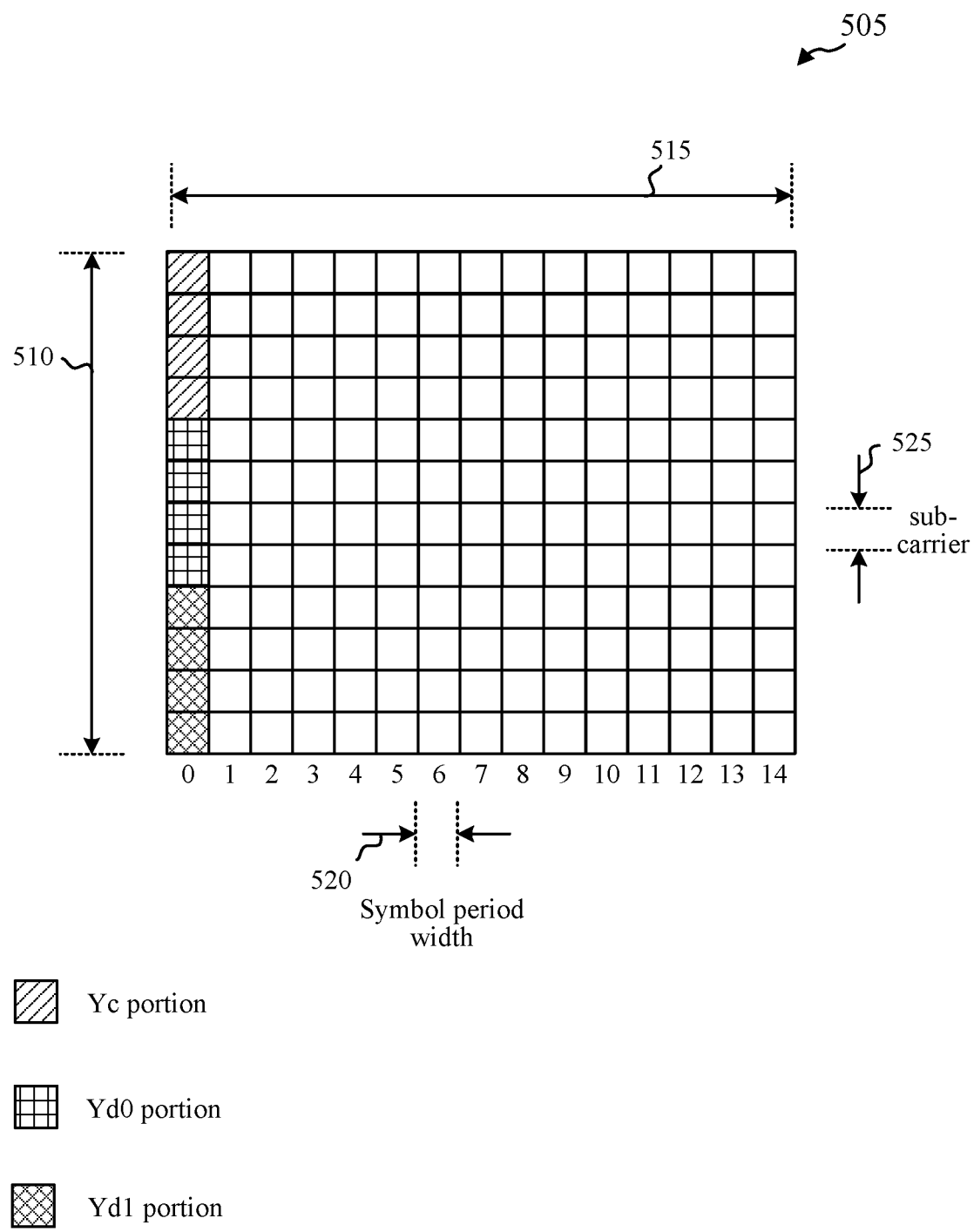
FIG. 5 illustrates an example of a control channel that supports polar code techniques in accordance with aspects of the present disclosure.

The mapper 225 may map bits of the polar-encoded codewords to resources of the control channel. FIG. 5 illustrates an example diagram 500 of control channel resources that support polar code techniques in accordance with various aspects of the present disclosure. In the depicted example, a control channel 505 may include resources that correspond to a bandwidth 510 and a time duration 515. The bandwidth 510 may correspond to a frequency range. The bandwidth 510 of a control channel 505 may be divided into sub-carriers in frequency and symbol periods in time. Depicted are a symbol period width 520 and a subcarrier 525. The mapper 225 may allocate a portion of the resources (e.g., one or more sub-carriers and one or more symbol periods within the of the bandwidth 510) of the control channel 505 to transport symbols generated from information field having one or more bits of the polar-encoded codewords. In some instances, the control channel 505 may be front-loaded and symbols for transporting common and dedicated information may be transmitted primarily within the first symbol period (e.g., symbol period 0) or within the first few symbol periods (e.g., symbol periods 0 or 1), but not in the other symbol periods. As depicted, resources of the control channel 505 for transporting symbols generated from information fields $Y_c$, $Y_{d0}$, and $Y_{d1}$ are depicted as being transported within symbol period 0. In other examples, symbols for transporting common and dedicated information may be transported in two or more symbol periods, using contiguous or non-contiguous sub-carriers, using contiguous or non-contiguous symbol periods, or the like.

As noted above, the polar-encoded common bits of information field $Y_c$ in each of the M+1 polar-encoded codewords is the same. Instead of allocating control channel resources to transport the $Y_c$ bits M+1 times, the mapper 225 may allocate control channel resources to transport symbols corresponding to a single instance of the $Y_c$ bits. As depicted, a common portion of the control channel resources (shown using a first type of shading) are allocated to carry a single instance of the $Y_c$ bits. The mapper 225 may allocate unique resources of the control channel 505 to transport symbols corresponding to the $Y_d$ bits for each UE in the set of M+1 UEs. In the depicted example, for M+1=2, a first dedicated portion of the control channel resources in symbol period 0 (shown using a second type of shading) are allocated to carry the $Y_{d0}$ bits, and a second dedicated portion of the control channel resources in symbol period 0 (shown using a third type of shading) are allocated to carry the $Y_{d1}$ bits. FIG. 5 is a simplified example, and the mapper 225 may allocate other or the remainder of the resources in the control channel 505 to the same or other UEs. For example, each of the common portion, the first dedicated portion, and the second dedicated portion may include one or more sub-carriers in one or more symbol periods. The mapper 225 may output the mapping, and the M+1 polar-encoded codewords Y, to the modulator 230 for transmission.

The modulator 230 may, according to the mapping, modulate bits of the M+1 polar-encoded codewords Y onto symbols for transmission within the control channel 505 to the UE 115-$a$ via wireless communication channel 235. Thus, the base station 105-$a$ may transmit a set of polar-encoded codewords in the control channel 505, wherein each of the codewords is generated using the same common information and using dedicated information that is UE-specific. The wireless communication channel 235 may distort the signal carrying the polar-encoded codeword with noise.

Figure 6:
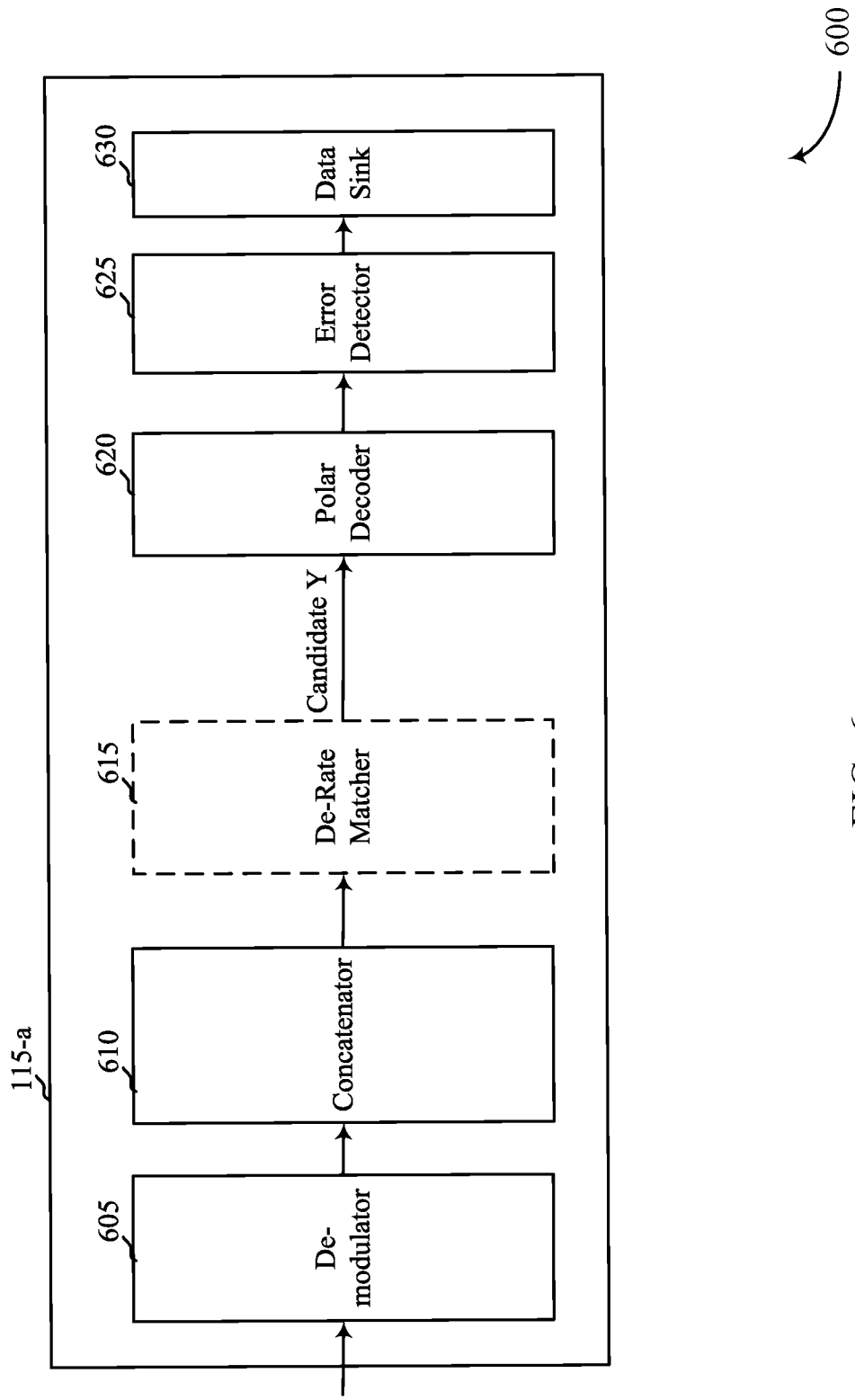
FIG. 6 illustrates an example of a receiver that supports polar code techniques in accordance with aspects of the present disclosure.

A receiver, such as a UE 115-a, may monitor the control channel for control information. FIG. 6 illustrates an example of diagram 600 of a receiver that supports polar code techniques in accordance with various aspects of the present disclosure. In some examples, UE 115-a is an example of a receiver and may implement aspects of wireless communications system 100. The UE 115-a may monitor the control channel 505 to receive a signal that includes the polar-encoded codewords. In an example, the UE 115-a may include a demodulator 605, a concatenator 610, a de-rate matcher 615, a polar decoder 620, an error detector 625, and a data sink 630.

The demodulator 605 may monitor the control channel to receive a signal that includes the polar-encoded codewords, and may input the demodulated signal into the concatenator 610. The demodulated signal(s) may be, for example, a sequence of logarithmic-likelihood ratio (LLR) values representing a probability value of a received bit being a '0' or a '1'. The base station 105-a may signal to inform the UE 115-a which portion of the control channel resources correspond to the common information $U_c$ and the dedicated information $U_d$ for the UE 11-a. The base station 105-a, for example, may inform the UE 115-a of the dedicated portion and the common portion of the control channel resources during connection set up and/or reconfiguration via radio resource control (RRC) signaling. The concatenator 610 may concatenate symbols received within the dedicated and common portions of the control channel resources (information fields of one or more symbols received within the dedicated and common portions of the control channel resources), and determine LLR values corresponding to the concatenated symbols or information fields. With reference to FIG. 5, a concatenator 610 of UE0 may determine the symbols transporting information fields $Y_c$ and $Y_{d0}$ within the dedicated and common portions of the control channel resources, and form a candidate codeword $Y_0$ from a sequence of LLR values corresponding to the symbols transporting information fields $Y_c$ and $Y_{d0}$. Likewise, a concatenator 610 of UE1 may determine the symbols transporting information fields $Y_c$ and $Y_{d1}$ within the dedicated and common portions of the control channel resources, and form a candidate codeword $Y_1$ from a sequence of LLR values corresponding to the symbols transporting information fields $Y_c$ and $Y_{d1}$.

If the base station 105-a performed rate-matching, the UE 115-a may include a de-rate matcher 615. The de-rate matcher 615 is shown in dashed lines to indicate that de-rate matching is optional and may be skipped. If included, the de-rate matcher 615 may know the rate-matching process used by the rate matcher 220 to perform rate-matching on a polar-encoded codeword, and may perform an inverse operation on a candidate codeword Y to generate a de-rate-matched candidate codeword Y. The de-rate matcher 615 may output the de-rate-matched candidate codeword Y to the polar decoder 620. For example, a de-rate matcher 615 of UE0 may output a de-rate matched candidate codeword $Y_0$. A de-rate matcher 615 of UE1 may output a de-rate matched candidate codeword $Y_1$. If rate matching is not used, the concatenator 610 may output the candidate codeword Y to the polar decoder 620.

The polar decoder 620 may perform a polar decoding operation on the candidate codeword Y inverse to the operations shown in either of FIG. 3 or 4. With reference to FIG. 3, polar decoding may be performed by reversing the direction of all arrows shown in the encoding branches of diagram 300. The polar decoder 620 may load the $Y_d$ and $Y_c$ portions of the candidate codeword Y into rightmost stage of the polar coding scheme 300 or 400, and may perform operations from right to left (e.g., "F" and "G" operations) to generate candidate $U_{d,\,EDC}$ and $U_c$ values from the bits of the candidate codeword Y. Polar decoding may be similarly performed using the example of FIG. 4. The polar decoder 620 may output the candidate $U_{d,\,EDC}$ and $U_c$ values to the error detector 625.

The error detector 625 may extract common information from the candidate $U_c$ values, and extract the dedicated information and the EDC values from the candidate $U_{d,EDC}$ values. The error detector 625 may calculate an EDC value from the extracted common information and the extracted dedicated information using the same EDC algorithm used by the EDC generator 210, and determine whether the extracted EDC value corresponds to the calculated EDC value (e.g., compare to determine if they match). If the extracted and calculated EDC values do not correspond, the error detector 625 may declare a decoding error and output a decoding output that indicates that a decoding error occurred. If the extracted and calculated EDC values correspond (e.g., match), the error detector 625 may output a decoding output that includes the extracted common information and the extracted dedicated information. In some aspects, the base station 105-a may scramble the dedicated information with an identifier of the UE (e.g., a radio network temporary identifier (RNTI)) to which the dedicated information is addressed, and the error detector 625 may descramble the dedicated information using its identifier prior to performing error detection. The error detector 625 may output the decoding output to the data sink 630. If decoding is successful, the data sink 630 may utilize or store the dedicated and/or common control information. Moreover, devices other than the base station 105-a and the user equipment 115-a may perform the operations described herein.

The techniques described herein may also enable the use of the same common information in a set of polar-coded codewords that each have one of multiple aggregation levels. An aggregation level may be the number of control channel elements (CCEs) in a control channel (e.g., PDCCH), and, in some instances, may be 1, 2, 4, or 8 CCEs. A CCE may be composed of one or more resource element groups (REGs) that each may include multiple resource elements (REs). A RE may be the smallest discrete time-frequency unit that may be allocated for communication (e.g., a resource element may be 1 subcarrier by 1 symbol).

Figure 7:
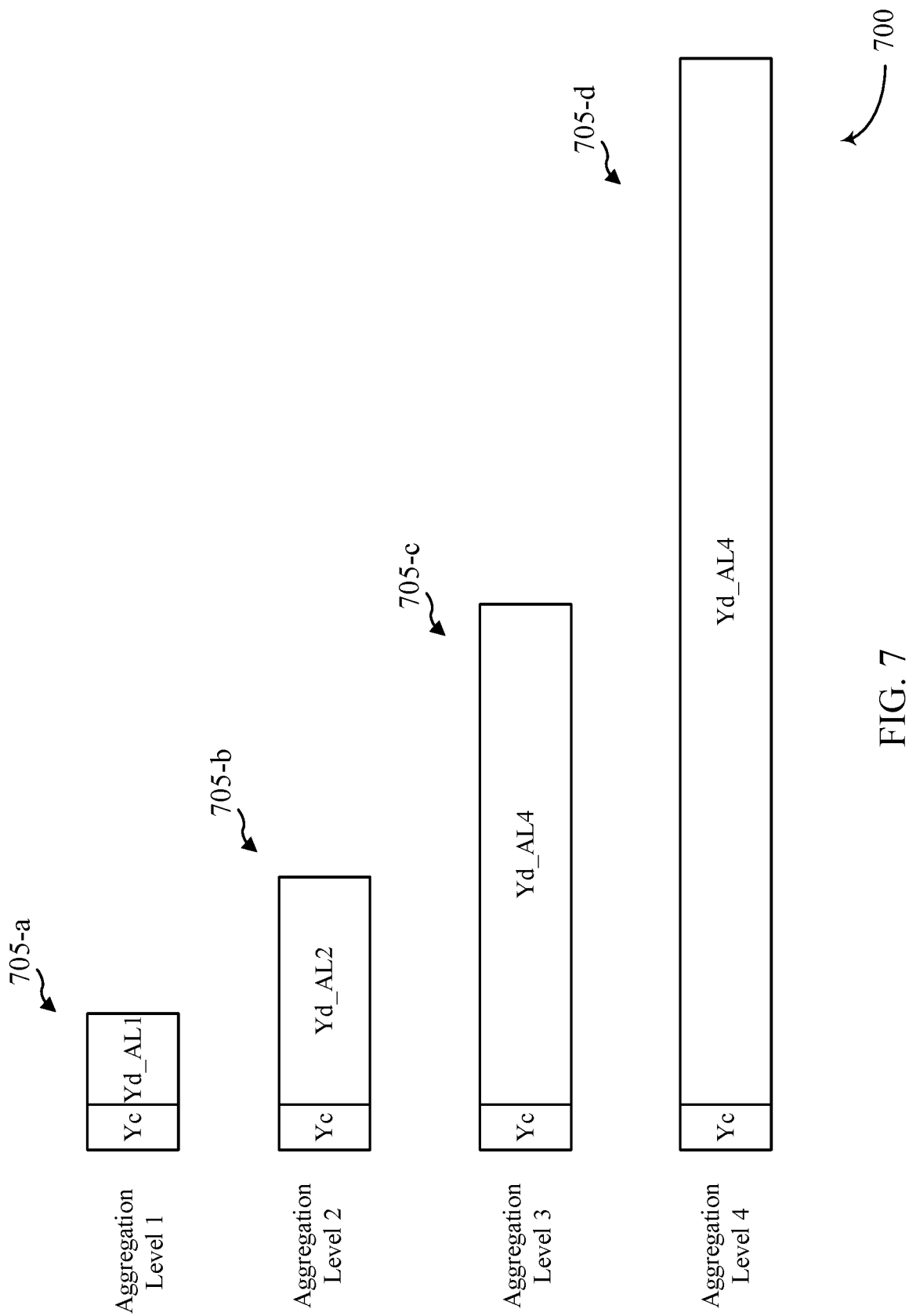
FIG. 7 illustrates an example of multiple aggregation levels that support polar code techniques in accordance with aspects of the present disclosure.

FIG. 7 illustrates an example diagram 700 of multiple aggregation levels that support polar code techniques in accordance with various aspects of the present disclosure. Depicted are polar-encoded codewords 705-a, 705-b, 705-c, and 705-d respectively corresponding to aggregation levels 1, 2, 4, and 8. Each of codewords 705-a, 705-b, 705-c, and 705-d may include the same polar-encoded common information field $Y_c$. Each of the codewords 705-a, 705-b, 705-c, and 705-d may include polar-encoded dedicated information field $Y_d$ having a different number of bits. In some examples, the polar-encoded common information field $Y_c$ may have the same, or different, number of bits as the polar-encoded dedicated information field $Y_d$. In the depicted example, codeword 705-a may have aggregation level 1 and include polar-encoded dedicated information field $Y_{d\_AL1}$. Codeword 705-b may have aggregation level 2 and include polar-encoded dedicated information field $Y_{d\_AL2}$. Codeword 705-c may have aggregation level 4 and include polar-encoded dedicated information field $Y_{d\_AL4}$. Codeword 705-d may have aggregation level 8 and include polar-encoded dedicated information field $Y_{d\_AL4}$.

In some aspects, the base station 105-a may select one of the available aggregation levels to use for sending dedicated and control information to a particular UE, and generate a polar-encoded codeword using the selected aggregation level. In some examples, the base station 105-a may not inform the UE 115-a of the selected aggregation level, but may inform the UE 115-a of a search space that includes a set of candidates within the control channel.

Each candidate may identify a common portion of the resources within the control channel 505 corresponding to the polar-encoded common information field $Y_c$. Each candidate may also identify a dedicated portion of the resources within the control channel 505 corresponding to a particular one of the aggregation levels. In some aspects, the identified dedicated portions may include unique resources within the control channel 505, or may include at least partially overlapping resources within the control channel 505. The UE 115-a may perform blind decoding of the control channel at the common portion and corresponding dedicated portion for at least one of the candidates within the set attempting to decode the polar-encoded codeword. If error detection passes for a particular candidate, in a manner similar to that described above in FIG. 6, the UE 115-a may skip attempting to decode another candidate and may output the dedicated and common information to the data sink 630.

When using multiple aggregation levels, the base station 105-a may also select a transmission power level from a set of power levels for transmission of the symbols corresponding to the polar-encoded common information field $Y_c$ within the control channel 505. In some aspects, the base station 105-a may use a higher power level for transmitting symbols corresponding to the polar-encoded common information field $Y_c$ because the common information is used by multiple UEs. For example, the base station 105-a may use a power level for transmitting symbols corresponding to the polar-encoded common information field $Y_c$ that is based on the cell coverage or UE expected to receive the common information field $Y_c$ that has the lowest channel characteristics.

The base station 105 may also use different aggregation levels for different UEs. Because the polar-encoded common information field $Y_c$ does not depend on polar-encoded dedicated information field $Y_d$, the base station 105 may select a desired aggregation level to use for each UE. In some examples, a larger aggregation level may include more redundancy and/or more protection for transmitted information, and the base station 105 may select an aggregation level accordingly. For example, a base station 105-a may select a larger aggregation level due to UE 115-a being at an outer limit of a base station's range. The selected power level for polar-encoded common information field $Y_c$ may also depend to the selected aggregation level, with a higher power level selected for a larger aggregation level.

Figure 8:
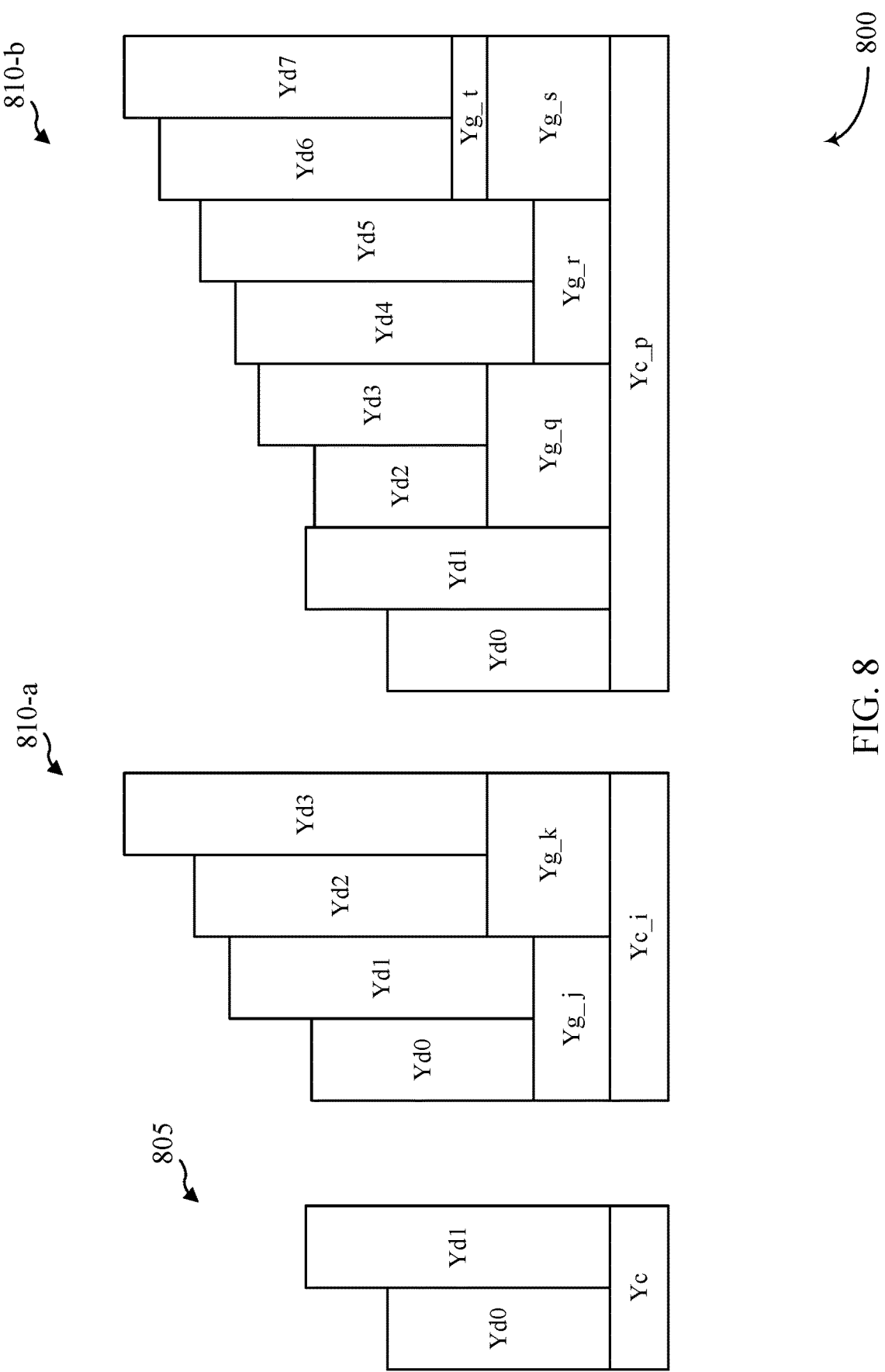
FIG. 8 illustrates an example of nested structures that support polar code techniques in accordance with aspects of the present disclosure.

The techniques described herein may extend to generation of a multi-level cross-referenceable nested polar code structure. FIG. 8 illustrates an example diagram 800 of multi-level nested polar code structures that support polar code techniques in accordance with various aspects of the present disclosure. A multi-level cross-referenceable nested polar code structure 810 permits a base station 105-a to define group information in addition to common information and dedicated information. Group information may be control information intended for a group of UEs.

In FIG. 8, a single level polar code structure 805 includes polar-encoded common information field $Y_c$, polar-encoded dedicated information field $Y_{d0}$ for UE0, and polar-encoded dedicated information field $Y_{d1}$ for UE1. The polar-encoded dedicated information fields $Y_{d0}$, $Y_{d1}$ are depicted to represent that they may include different numbers of bits. Selection of a different aggregation level or rate matching may cause the polar-encoded dedicated information fields $Y_{d0}$, $Y_{d1}$ to have different numbers of bits. In other examples, each of the polar-encoded dedicated information in any of structures 805, 810-a, or 810-b may include the same number of bits.

A multi-level cross-referenceable nested polar code structure 810 includes polar-encoded group information field $Y_g$, in addition to polar-encoded common information $Y_c$, and polar-encoded dedicated information field $Y_d$ for two or more UEs. The base station 105-a may generate the polar-encoded group information field $Y_g$ in a similar manner as the description provided above with reference to FIGS. 2-5.

With reference to FIG. 3, the base station 105-a may use some of the encoding branches for polar encoding group information $U_g$ to generate polar-encoded group information field $Y_g$. The relative locations of the information fields $Y_c$, $Y_g$, and $Y_d$ in the structure 810 may reflect branch dependency within a polar encoding scheme, with $Y_c$ being independent of information fields $Y_g$ and $Y_d$, $Y_g$ being a function of $Y_c$ and independent of information fields $Y_d$, and $Y_d$ being a function of both information fields $Y_c$ and $Y_g$. For example, common information $U_c$ may be loaded into branches 6 and 7 of polar coding scheme 300, group information $U_g$ may be loaded into branches 4 and 5, and dedicated information/EDC value $U_{d\_EDC}$ may be loaded into branches 0, 1, 2, and 3. Branches 6 and 7 may output the polar-encoded common information field $Y_c$. Branches 4 and 5 may output the polar-encoded group information field $Y_g$. Branches 0, 1, 2, and 3 may output the polar-encoded dedicated information field $Y_d$. These principles may be applied to load group information $U_g$, common information $U_c$, and dedicated information/EDC value $U_{d\_EDC}$ into encoding branches in other arrangements using similar polar coding schemes.

With reference to FIGS. 2 and 5, mapper 225 may allocate a portion of the resources of the control channel 505 to transport symbols corresponding to the polar-encoded group information field $Y_g$, in addition to allocating resources to transport symbols corresponding to the polar-encoded common information field $Y_c$ and polar-encoded dedicated information field $Y_d$. Similar to the polar-encoded common information $Y_c$, the polar-encoded group information field $Y_g$ is the same for multiple UEs (e.g., UEs in the group) and hence the mapper 225 allocates symbols to transport a single instance of the polar-encoded group information field $Y_g$. In a similar manner to the description provided in FIG. 6, a UE in the group monitoring the control channel 505 may concatenate symbols or information fields of one or more symbols from a group portion, a common portion, and a dedicated portion of the control channel 505 to form a codeword from LLRs determined from those symbols. The candidate codeword Y may include polar-encoded common information field $Y_c$, polar-encoded group information field $Y_g$, and polar-encoded dedicated information field $Y_d$. The UE 115-a in the group may be perform polar decoding and error detection in a similar manner to the description provided in FIG. 6.

Two examples of multi-level cross-referenceable nested polar code structures 810-a, 810-b, are shown in FIG. 8. The multi-level structure 810-a includes polar-encoded common information $Y_{c\_i}$ that corresponds to common information $U_{c\_i}$ that is being sent to each of UE0, UE1, UE2 and UE3. The multi-level structure 810-*a* includes two instances of polar-encoded group information fields $Y_{g\_j}$ and $Y_{g\_k}$. Polar-encoded group information field $Y_{g\_j}$ includes group information $U_{g\_j}$ intended for UE0 and UE1, and polar-encoded group information field $Y_{g\_k}$ includes group information $U_{g\_k}$ intended for UE2 and UE3.

The multi-level structure 810-*b* includes polar-encoded common information field $Y_{c\_p}$ that corresponds to common information $U_{c\_p}$ that is being sent to each of UE0, UE1, UE2 and UE3. The multi-level structure 810-*b* includes four instances of polar-encoded group information fields $Y_{g\_q}$, $Y_{g\_r}$, $Y_{g\_s}$, and $Y_{g\_t}$. Polar-encoded group information field $Y_{g\_q}$ is generated based on group information $U_{g\_q}$ intended for UE2 and UE3, polar-encoded group information field $Y_{g\_r}$ is generated based on group information $U_{g\_r}$ intended for UE4 and UE5, polar-encoded group information field $Y_{g\_s}$ is generated based on group information $U_{g\_s}$ intended for UE6 and UE7, and polar-encoded group information field $Y_{g\_t}$ is generated based on group information $U_{g\_t}$ intended for UE6 and UE7.

Polar-encoded group information fields $Y_{g\_s}$ and $Y_{g\_t}$ each include group information for the same two UEs (e.g., UE6 and UE7). In some examples, polar-encoded group information field $Y_{g\_s}$ may include different information than polar-encoded group information field $Y_{g\_t}$. In some examples, polar-encoded group information field $Y_{g\_s}$ may be mapped to different resources of the control channel than polar-encoded group information field $Y_{g\_t}$, thereby permitting more efficient usage of the control channel 505. Multi-level cross-referenceable nested polar code structures 810 may have a number of applications, including to enable new services and/or applications in broadcast/control signaling in enhanced mobile broadband (eMBB), ultra-reliable low latency communications (URLLC), massive machine-type communications (mMTC), or the like.

Beneficially, the techniques provided herein describe a nested polar codeword structure that enables transmission of common information and UE-specific dedicated information. The techniques may conserve control channel resources by transmitting polar-encoded common information $Y_c$ for multiple polar-encoded codewords in a common portion of a control channel, and each of multiple UEs may concatenate polar-encoded common information field $Y_c$ derived from the common portion with polar-encoded dedicated information field $Y_d$ derived from a dedicated portion of the control channel to form a polar-encoded codeword for decoding.

Also beneficially, the dedicated and control information may be jointly encoded permitting use of a larger block size as compared to conventional solutions. Separate encoding and decoding between common and dedicated information has lower coding efficiency due to a smaller code block, whereas the technique described herein provide joint coding efficiency resulting in improved performance by using a joint (larger) code block. Joint encoding may also reduce encoding/decoding latency, decrease power consumption, reduce run-time complexity, or the like.

Figure 9:
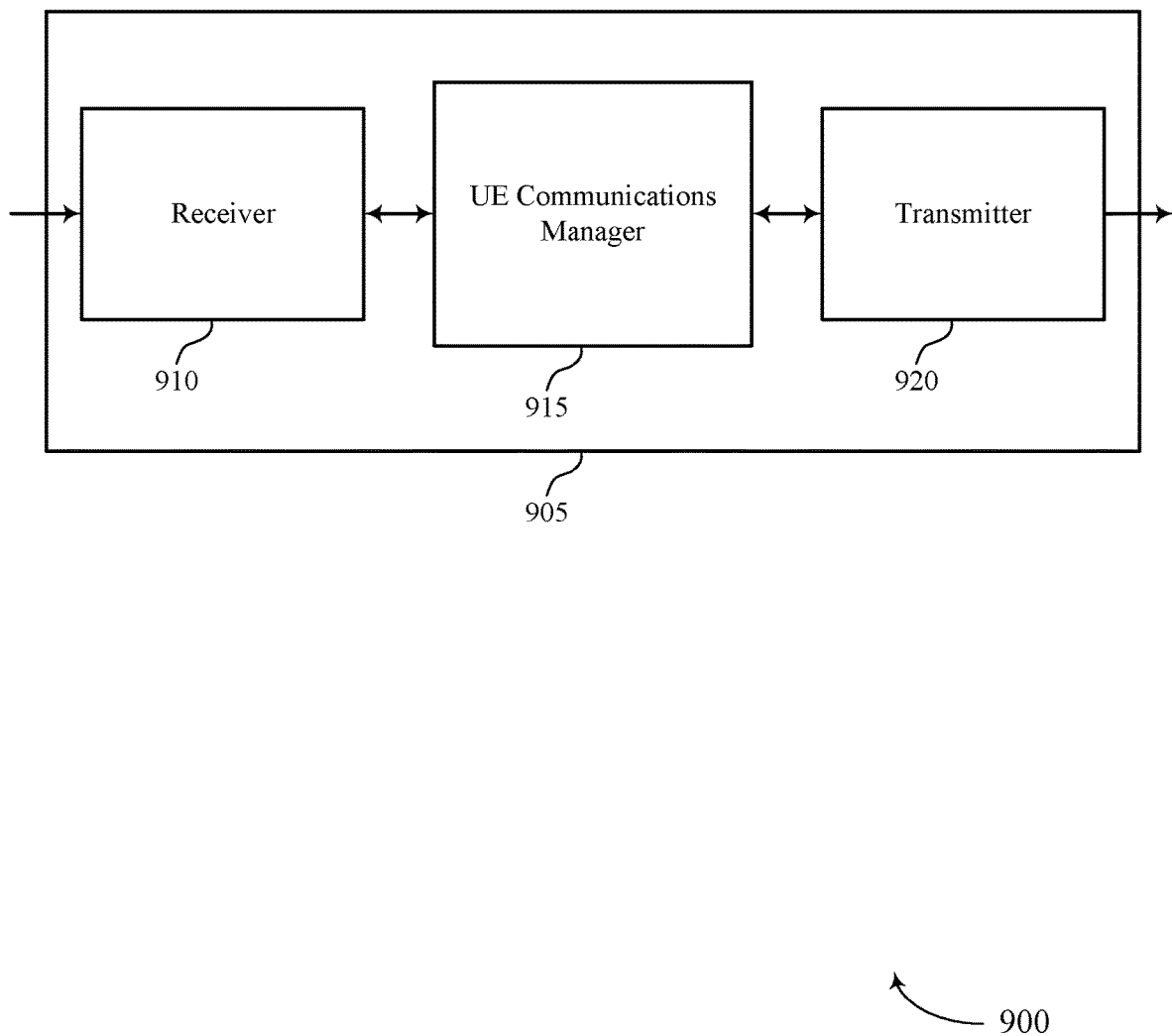
FIGS. 9 through 11 show block diagrams of a device that supports polar code techniques in accordance with aspects of the present disclosure.

FIG. 9 shows a block diagram 900 of a wireless device 905 that supports polar code techniques in accordance with aspects of the present disclosure. Wireless device 905 may be an example of aspects of a UE 115 as described herein. Wireless device 905 may include receiver 910, UE communications manager 915, and transmitter 920. Wireless device 905 may also include a processor. Each of these components may be in communication with one another (e.g., via one or more buses).

Receiver 910 may receive a signal include a polar-encoded codeword. The receiver 910 may be an example of aspects of the transceiver 1235 described with reference to FIG. 12. The receiver 910 may utilize a single antenna or a set of antennas.

UE communications manager 915 may be an example of aspects of the UE communications manager 1215 described with reference to FIG. 12.

UE communications manager 915 and/or at least some of its various sub-components may be implemented in hardware, software executed by a processor, firmware, or any combination thereof. If implemented in software executed by a processor, the functions of the UE communications manager 915 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The UE communications manager 915 and/or at least some of its various sub-components may be physically located at various positions, including being distributed such that portions of functions are implemented at different physical locations by one or more physical devices. In some examples, UE communications manager 915 and/or at least some of its various sub-components may be a separate and distinct component in accordance with various aspects of the present disclosure. In other examples, UE communications manager 915 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 915 may monitor a common portion and a dedicated portion of a control channel, the common portion assigned to a first set of control channel resources and the dedicated portion assigned to a second set of control channel resources within the control channel, concatenate, based on the monitoring, symbols of the first and second sets of control channel resources (or information fields of one or more symbols received via the first and second sets of control channel resources) to form a polar-encoded codeword, and decode the polar-encoded codeword to obtain common information from the common portion and dedicated information from the dedicated portion.

Transmitter 920 may transmit signals generated by other components of the device, including transmission within a control channel of a signal that includes a polar-encoded codeword. In some examples, the transmitter 920 may be collocated with a receiver 910 in a transceiver module. For example, the transmitter 920 may be an example of aspects of the transceiver 1235 described with reference to FIG. 12. The transmitter 920 may utilize a single antenna or a set of antennas.

Figure 10:
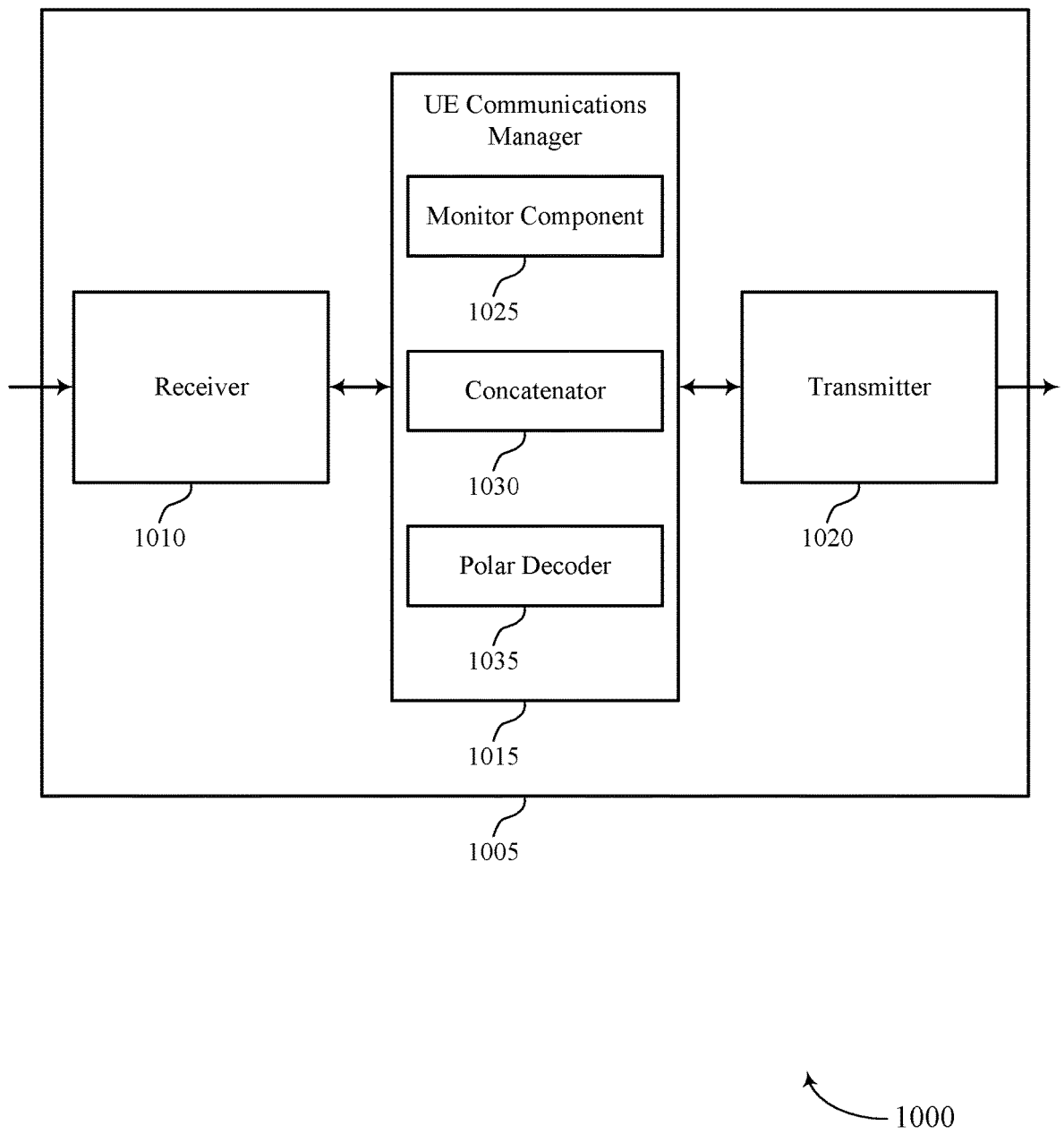

FIG. 10 shows a block diagram 1000 of a wireless device 1005 that supports polar code techniques in accordance with aspects of the present disclosure. Wireless device 1005 may be an example of aspects of a wireless device 905 or a UE 115 as described with reference to FIG. 9. Wireless device 1005 may include receiver 1010, UE communications manager 1015, and transmitter 1020. Wireless device 1005 may also include a processor. Each of these components may be in communication with one another (e.g., via one or more buses).

Receiver 1010 may receive a signal that includes a polar-encoded codeword. The receiver 1010 may be an example of aspects of the transceiver 1235 described with reference to FIG. 12. The receiver 1010 may utilize a single antenna or a set of antennas.

UE communications manager 1015 may be an example of aspects of the UE communications manager 1215 described with reference to FIG. 12.

UE communications manager 1015 may also include monitor component 1025, concatenator 1030, and polar decoder 1035.

Monitor component 1025 may monitor a common portion and a dedicated portion of a control channel, the common portion assigned to a first set of control channel resources and the dedicated portion assigned to a second set of control channel resources within the control channel. In some aspects, monitoring a group portion of the control channel, the group portion assigned to a third set of control channel resources within the control channel.

Concatenator 1030 may concatenate, based on the monitoring, symbols of the first and second sets of control channel resources (or information fields of one or more symbols received via the first and second sets of control channel resources) to form a polar-encoded codeword. For example, concatenator 1030 may concatenate information fields $Y_c$ and $Y_d$, each of which may comprise one or more bits. In some aspects, concatenating includes concatenating symbols of the first, second, and third sets of control channel resources (or information fields of one or more symbols received via the first, second, and third sets of control channel resources) to form the polar-encoded codeword. For example, concatenator 1030 may concatenate information fields $Y_c$, $Y_g$, and $Y_d$, each of which may comprise one or more bits.

Polar decoder 1035 may decode the polar-encoded codeword to obtain common information from the common portion and dedicated information from the dedicated portion. In some aspects, the common information is control information for a set of UEs that includes the UE. In some aspects, the dedicated information is control information specific to the UE. In some aspects, decoding of the polar-encoded codeword includes decoding the polar-encoded codeword to obtain the group information from the group portion. In some aspects, each of the first and second sets of control channel resources is a different set of sub-carriers of the control channel.

Transmitter 1020 may transmit signals generated by other components of the device, including transmission within a control channel of a signal that includes a polar-encoded codeword. In some examples, the transmitter 1020 may be collocated with a receiver 1010 in a transceiver module. For example, the transmitter 1020 may be an example of aspects of the transceiver 1235 described with reference to FIG. 12. The transmitter 1020 may utilize a single antenna or a set of antennas.

Figure 11:
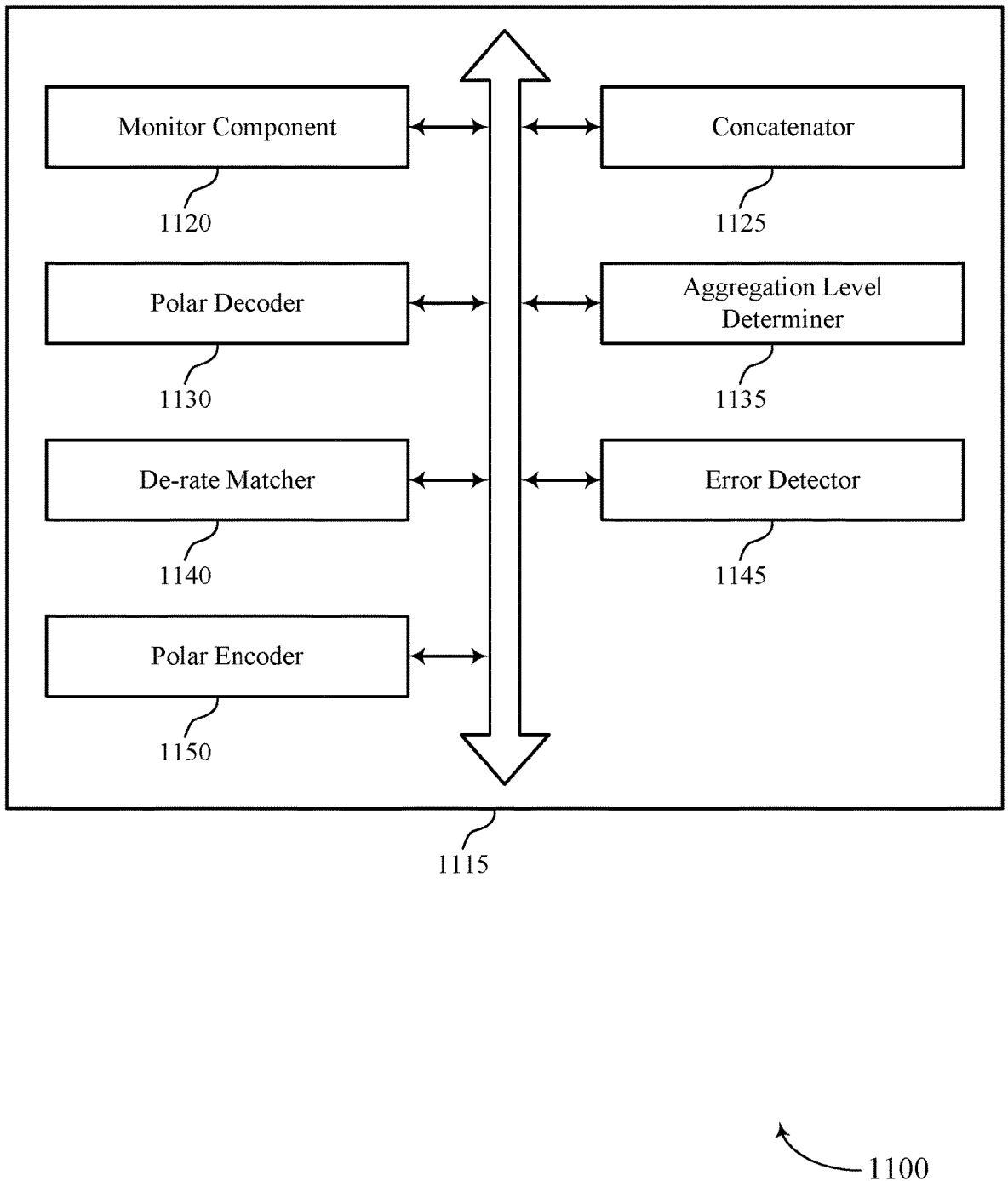

FIG. 11 shows a block diagram 1100 of a UE communications manager 1115 that supports polar code techniques in accordance with aspects of the present disclosure. The UE communications manager 1115 may be an example of aspects of a UE communications manager 915, a UE communications manager 1015, or a UE communications manager 1215 described with reference to FIGS. 9, 10, and 12. The UE communications manager 1115 may include monitor component 1120, concatenator 1125, polar decoder 1130, aggregation level determiner 1135, de-rate matcher 1140, error detector 1145, and polar encoder 1150. Each of these modules may communicate, directly or indirectly, with one another (e.g., via one or more buses).

Monitor component 1120 may monitor a common portion and a dedicated portion of a control channel, the common portion assigned to a first set of control channel resources and the dedicated portion assigned to a second set of control channel resources within the control channel. In some aspects, monitoring a group portion of the control channel, the group portion assigned to a third set of control channel resources within the control channel. In some aspects, each of the first and second sets of control channel resources is a different set of sub-carriers of the control channel.

Concatenator 1125 may concatenate, based on the monitoring, symbols of the first and second sets of control channel resources (or information fields of one or more symbols received via the first and second sets of control channel resources) to form a polar-encoded codeword. For example, concatenator 1125 may concatenate information fields $Y_c$ and $Y_d$, each of which may comprise one or more bits. In some aspects, concatenating includes concatenating symbols of the first, second, and third sets of control channel resources (or information fields of one or more symbols received via the first, second, or third sets of control channel resources) to form the polar-encoded codeword. For example, concatenator 1125 may concatenate information fields $Y_c$, $Y_g$, and $Y_d$, each of which may comprise one or more bits.

Polar decoder 1130 may decode the polar-encoded codeword to obtain common information from the common portion and dedicated information from the dedicated portion. In some aspects, the common information is control information for a set of UEs that includes the UE. In some aspects, the dedicated information is control information specific to the UE. In some aspects, decoding of the polar-encoded codeword includes decoding the polar-encoded codeword to obtain the group information from the group portion.

Aggregation level determiner 1135 may determine a set of aggregation levels. In some aspects, concatenating the symbols of the first and second sets of control channel resources (or information fields of one or more symbols received via the first and second sets of control channel resources) to form a polar-encoded codeword corresponds to a first aggregation level within the set of aggregation levels. In some aspects, each of the aggregation levels includes a same number of bits for the common information and the same or a different number of bits for the dedicated information.

De-rate matcher 1140 may perform de-rate matching to form the polar-encoded codeword.

Error detector 1145 may determine whether the common information, the dedicated information, or both, pass error detection based on the at least one EDC value. In some aspects, decoding the polar-encoded codeword includes: obtaining at least one EDC value from the polar-encoded codeword. In some aspects, the at least one EDC value is in the dedicated information.

Polar encoder 1150 may include a set of encoding branches, where the set of encoding branches are divided into at least a first encoding branch subset and a second encoding branch subset, outputs of the first encoding branch subset being independent of inputs to the second encoding branch subset, and where the polar encoder 1150 encodes the common information using the first encoding branch subset and the dedicated information using the second encoding branch subset to generate the polar-encoded codeword.

Figure 12:
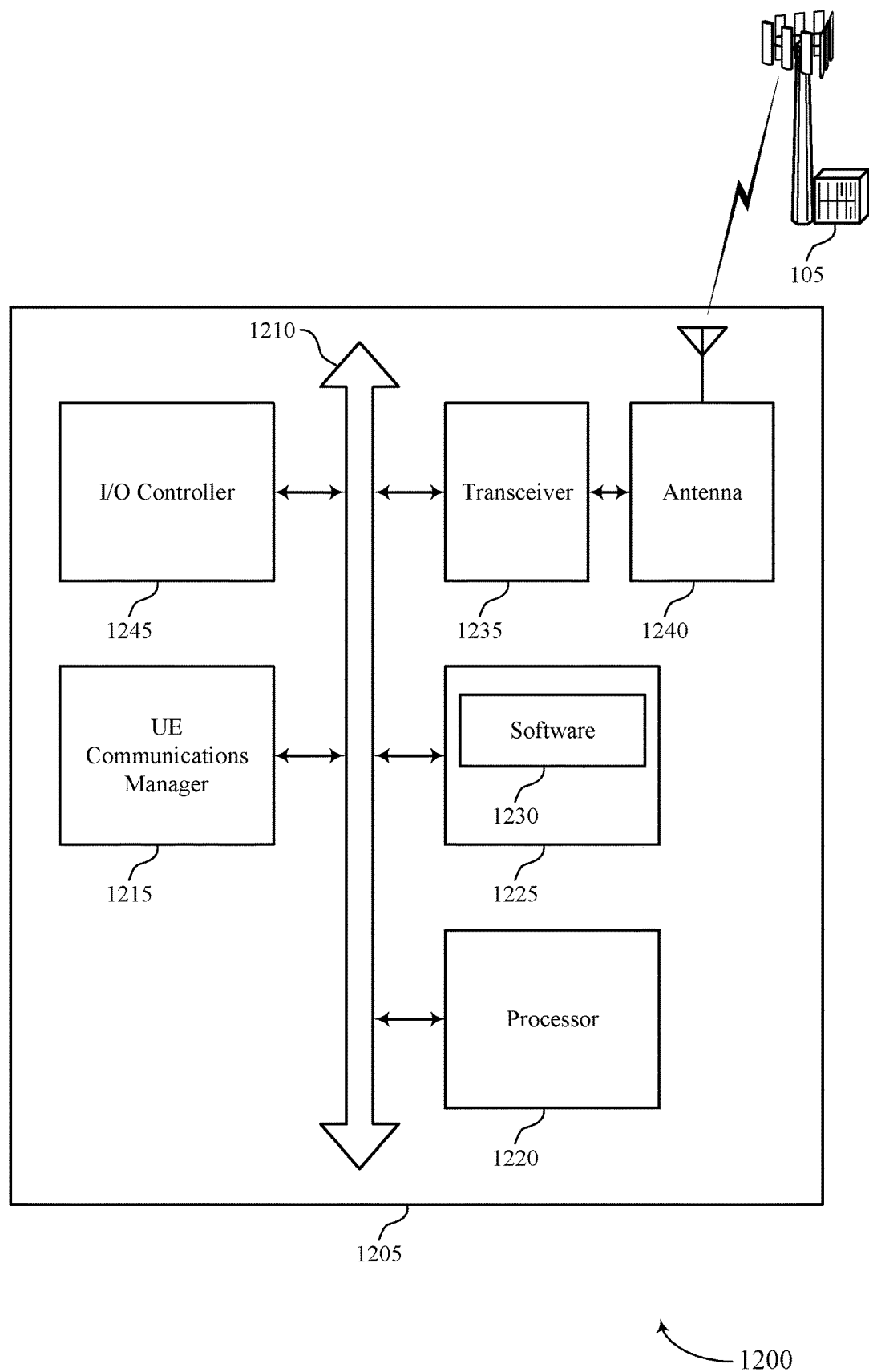
FIG. 12 illustrates a block diagram of a system including a UE that supports polar code techniques in accordance with aspects of the present disclosure.

FIG. 12 shows a diagram of a system 1200 including a device 1205 that supports polar code techniques in accordance with aspects of the present disclosure. Device 1205 may be an example of or include the components of wireless device 905, wireless device 1005, or a UE 115 as described above, e.g., with reference to FIGS. 9 and 10. Device 1205 may include components for bi-directional voice and data communications including components for transmitting and receiving communications, including UE communications manager 1215, processor 1220, memory 1225, software 1230, transceiver 1235, antenna 1240, and I/O controller 1245. These components may be in electronic communication via one or more buses (e.g., bus 1210). Device 1205 may communicate wirelessly with one or more base stations 105.

Processor 1220 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some aspects, processor 1220 may be configured to operate a memory array using a memory controller. In other aspects, a memory controller may be integrated into processor 1220. Processor 1220 may be configured to execute computer-readable instructions stored in a memory to perform various functions (e.g., functions or tasks supporting polar codes with a cross-referenceable nested structure for hierarchical signaling).

Memory 1225 may include random access memory (RAM) and read only memory (ROM). The memory 1225 may store computer-readable, computer-executable software 1230 including instructions that, when executed, cause the processor to perform various functions described herein. In some aspects, the memory 1225 may contain, among other things, a basic input/output system (BIOS) that may control basic hardware or software operation such as the interaction with peripheral components or devices.

Software 1230 may include code to implement aspects of the present disclosure, including code to support polar codes with a cross-referenceable nested structure for hierarchical signaling. Software 1230 may be stored in a non-transitory computer-readable medium such as system memory or other memory. In some aspects, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In some aspects, the wireless device may include a single antenna 1240. However, in some aspects the device may have more than one antenna 1240 that may be capable of concurrently transmitting or receiving multiple wireless transmissions.

I/O controller 1245 may manage input and output signals for device 1205. I/O controller 1245 may also manage peripherals not integrated into device 1205. In some aspects, I/O controller 1245 may represent a physical connection or port to an external peripheral. In some aspects, I/O controller 1245 may utilize an operating system such as iOS®, ANDROID®, MS-DOS®, MS-WINDOWS®, OS/2®, UNIX®, LINUX®, or another known operating system. In other aspects, I/O controller 1245 may represent or interact with a modem, a keyboard, a mouse, a touchscreen, or a similar device. In some aspects, I/O controller 1245 may be implemented as part of a processor. In some aspects, a user may interact with device 1205 via I/O controller 1245 or via hardware components controlled by I/O controller 1245.

Figure 13:
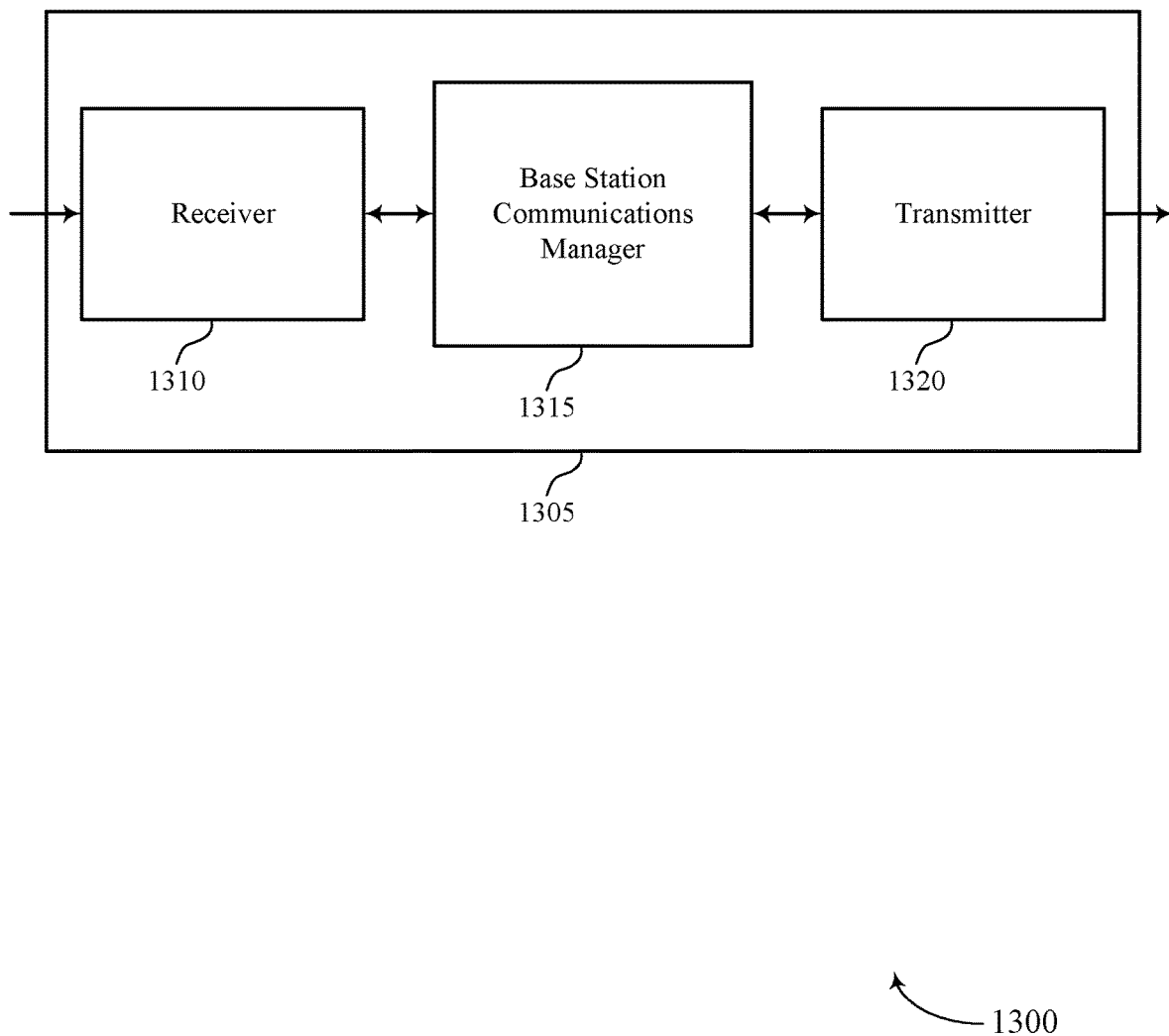
FIGS. 13 through 15 show block diagrams of a device that supports polar code techniques in accordance with aspects of the present disclosure.

FIG. 13 shows a block diagram 1300 of a wireless device 1305 that supports polar code techniques in accordance with aspects of the present disclosure. Wireless device 1305 may be an example of aspects of a base station 105 as described herein. Wireless device 1305 may include receiver 1310, base station communications manager 1315, and transmitter 1320. Wireless device 1305 may also include a processor. Each of these components may be in communication with one another (e.g., via one or more buses).

Receiver 1310 may receive a signal include a polar-encoded codeword. The receiver 1310 may be an example of aspects of the transceiver 1635 described with reference to FIG. 16. The receiver 1310 may utilize a single antenna or a set of antennas.

Base station communications manager 1315 may be an example of aspects of the base station communications manager 1615 described with reference to FIG. 16.

Base station communications manager 1315 and/or at least some of its various sub-components may be implemented in hardware, software executed by a processor, firmware, or any combination thereof. If implemented in software executed by a processor, the functions of the base station communications manager 1315 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The base station communications manager 1315 and/or at least some of its various sub-components may be physically located at various positions, including being distributed such that portions of functions are implemented at different physical locations by one or more physical devices. In some examples, base station communications manager 1315 and/or at least some of its various sub-components may be a separate and distinct component in accordance with various aspects of the present disclosure. In other examples, base station communications manager 1315 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station communications manager 1315 may polar encoding common information and dedicated information to form a polar-encoded codeword, map a first set of bits of the polar-encoded codeword to a first set of control channel resources of a control channel and a second set of bits of the polar-encoded codeword to a second set of control channel resources of the control channel, and transmit the polar-encoded codeword within the control channel using the first and second sets of control channel resources.

Transmitter 1320 may transmit signals generated by other components of the device, including transmission within a control channel of a signal that includes a polar-encoded codeword. In some examples, the transmitter 1320 may be collocated with a receiver 1310 in a transceiver module. For example, the transmitter 1320 may be an example of aspects of the transceiver 1635 described with reference to FIG. 16. The transmitter 1320 may utilize a single antenna or a set of antennas.

Figure 14:
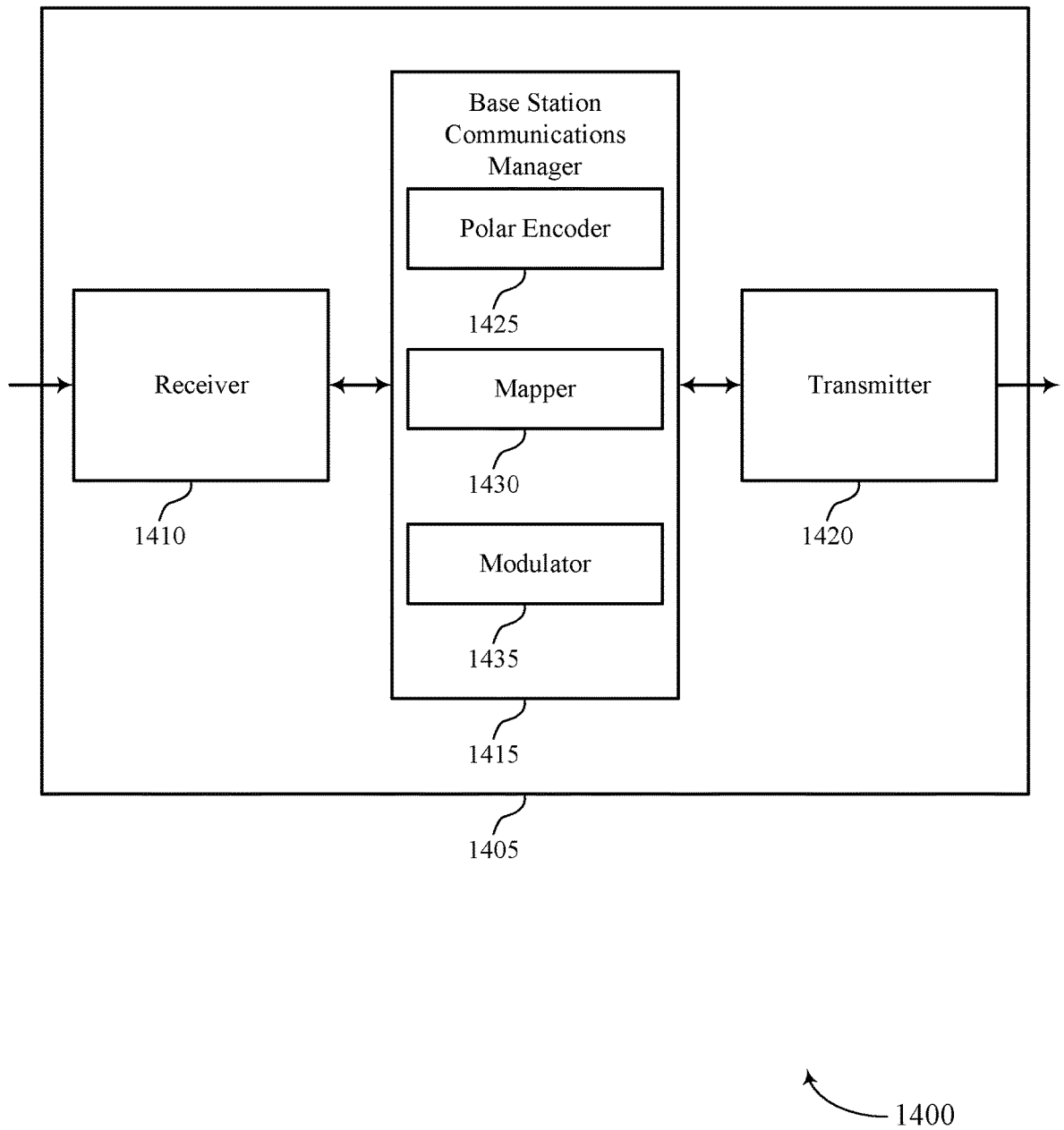

FIG. 14 shows a block diagram 1400 of a wireless device 1405 that supports polar code techniques in accordance with aspects of the present disclosure. Wireless device 1405 may be an example of aspects of a wireless device 1305 or a base station 105 as described with reference to FIG. 13. Wireless device 1405 may include receiver 1410, base station communications manager 1415, and transmitter 1420. Wireless device 1405 may also include a processor. Each of these components may be in communication with one another (e.g., via one or more buses).

Receiver 1410 may receive a signal include a polar-encoded codeword. The receiver 1410 may be an example of aspects of the transceiver 1635 described with reference to FIG. 16. The receiver 1410 may utilize a single antenna or a set of antennas.

Base station communications manager 1415 may be an example of aspects of the base station communications manager 1615 described with reference to FIG. 16.

Base station communications manager 1415 may also include polar encoder 1425, mapper 1430, and modulator 1435.

Polar encoder 1425 may polar encode common information and dedicated information to form a polar-encoded codeword and polar encoding the common information and second dedicated information to form a second polar-encoded codeword, where the dedicated information is specific to a first UE, the second dedicated information is specific to a second UE, and the common information is common to the first and second UEs. In some aspects, the polar encoding includes: polar encoding the common information, the dedicated information, and group information to form the polar-encoded codeword. In some aspects, polar encoder 1425 may include a set of encoding branches, where the set of encoding branches are divided into at least a first encoding branch subset and a second encoding branch subset, outputs of the first encoding branch subset being independent of inputs to the second encoding branch subset. In some aspects, polar encoder 1425 may encode the common information using the first encoding branch subset and the dedicated information using the second encoding branch subset.

Mapper 1430 may map a first set of bits of the polar-encoded codeword to a first set of control channel resources of a control channel and a second set of bits of the polar-encoded codeword to a second set of control channel resources of the control channel. Mapper 1430 may map a first set of bits of the second polar-encoded codeword to the first set of control channel resources of the control channel and a second set of bits of the second polar-encoded codeword to a second set of control channel resources of the control channel. For example, mapper 1430 may map information fields $Y_c$ and $Y_d$, each of which may comprise one or more bits. In some aspects, each of the first and second sets of control channel resources is a different set of sub-carriers within the control channel. In some aspects, mapping further includes mapping a third set of bits of the polar-encoded codeword to a third set of control channel resources within the control channel. For example, mapper 1430 may map information fields $Y_c$, $Y_g$, and $Y_d$, each of which may comprise one or more bits.

Modulator 1435 may transmit the polar-encoded codeword within the control channel using the first and second sets of control channel resources and transmit the second polar-encoded codeword within the control channel using the first and third sets of control channel resources within the same transmission time interval that the polar-encoded codeword is transmitted. In some aspects, transmitting further includes transmitting the polar-encoded codeword within the control channel using the first, second, and third sets of control channel resources.

Transmitter 1420 may transmit signals generated by other components of the device, including transmission within a control channel of a signal that includes a polar-encoded codeword. In some examples, the transmitter 1420 may be collocated with a receiver 1410 in a transceiver module. For example, the transmitter 1420 may be an example of aspects of the transceiver 1635 described with reference to FIG. 16. The transmitter 1420 may utilize a single antenna or a set of antennas.

Figure 15:
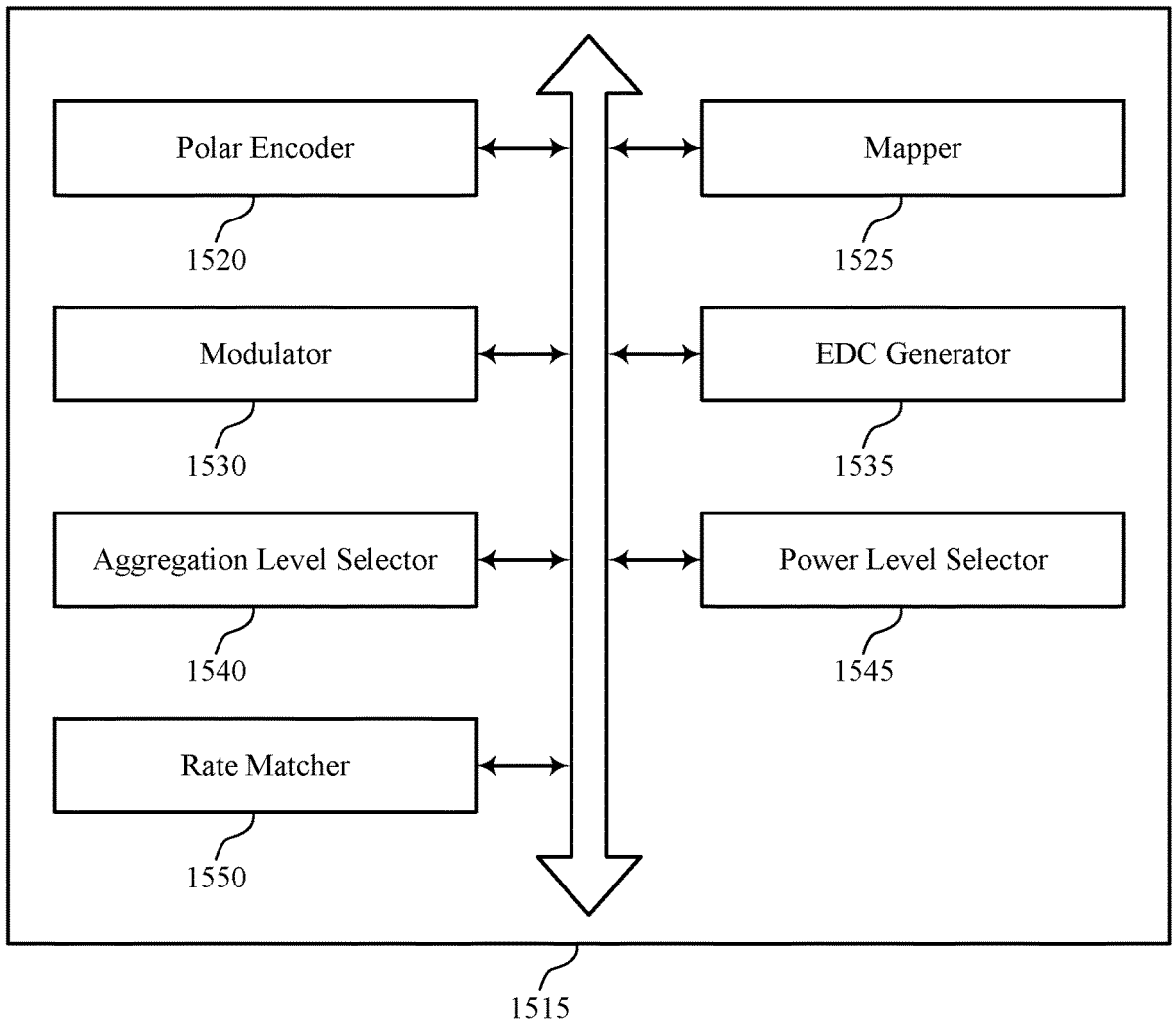

FIG. 15 shows a block diagram 1500 of a base station communications manager 1515 that supports polar code techniques in accordance with aspects of the present disclosure. The base station communications manager 1515 may be an example of aspects of a base station communications manager 1615 described with reference to FIGS. 13, 14, and 16. The base station communications manager 1515 may include polar encoder 1520, mapper 1525, modulator 1530, EDC generator 1535, aggregation level selector 1540, power level selector 1545, and rate matcher 1550. Each of these modules may communicate, directly or indirectly, with one another (e.g., via one or more buses).

Polar encoder 1520 may polar encode common information and dedicated information to form a polar-encoded codeword and polar encoding the common information and second dedicated information to form a second polar-encoded codeword, where the dedicated information is specific to a first UE, the second dedicated information is specific to a second UE, and the common information is common to the first and second UEs. In some aspects, the polar encoding includes polar encoding the common information, the dedicated information, and group information to form the polar-encoded codeword. In some aspects, polar encoder 1520 includes a set of encoding branches, where the set of encoding branches are divided into at least a first encoding branch subset and a second encoding branch subset, outputs of the first encoding branch subset being independent of inputs to the second encoding branch subset. In some aspects, polar encoder 1520 encodes the common information using the first encoding branch subset and the dedicated information using the second encoding branch subset.

Mapper 1525 may map a first set of bits of the polar-encoded codeword to a first set of control channel resources of a control channel and a second set of bits of the polar-encoded codeword to a second set of control channel resources of the control channel. Mapper 1525 may map a first set of bits of the second polar-encoded codeword to the first set of control channel resources of the control channel and a second set of bits of the second polar-encoded codeword to a second set of control channel resources of the control channel. For example, mapping may include mapping information fields $Y_c$ and $Y_d$, each of which may comprise one or more bits. In some aspects, each of the first and second sets of control channel resources is a different set of sub-carriers within the control channel. In some aspects, mapping further includes mapping a third set of bits of the polar-encoded codeword to a third set of control channel resources within the control channel. For example, mapping may include mapping information fields $Y_c$, $Y_g$, and $Y_d$, each of which may comprise one or more bits.

Modulator 1530 may transmit the polar-encoded codeword within the control channel using the first and second sets of control channel resources and transmit the second polar-encoded codeword within the control channel using the first and third sets of control channel resources within the same transmission time interval that the polar-encoded codeword is transmitted. In some aspects, transmitting further includes transmitting the polar-encoded codeword within the control channel using the first, second, and third sets of control channel resources.

EDC generator 1535 may generate at least one EDC value based on the common information, the dedicated information, or both, where the polar encoding includes polar encoding the common information, the dedicated information, and the at least one EDC value to form the polar-encoded codeword.

Aggregation level selector 1540 may select an aggregation level from a set of aggregation levels, where the mapping of the second set of bits of the polar-encoded codeword to the second set of control channel resources of the control channel is based on the selected aggregation level.

Power level selector 1545 may determine a power level for the first set of bits of the polar-encoded codeword based on the selected aggregation level, where the transmitting of the polar-encoded codeword within the control channel is based on the determined power level.

Rate matcher 1550 may perform rate matching on the polar-encoded codeword to generate a rate-matched polar-encoded codeword, where the transmitting includes transmitting the rate-matched polar-encoded codeword.

Figure 16:
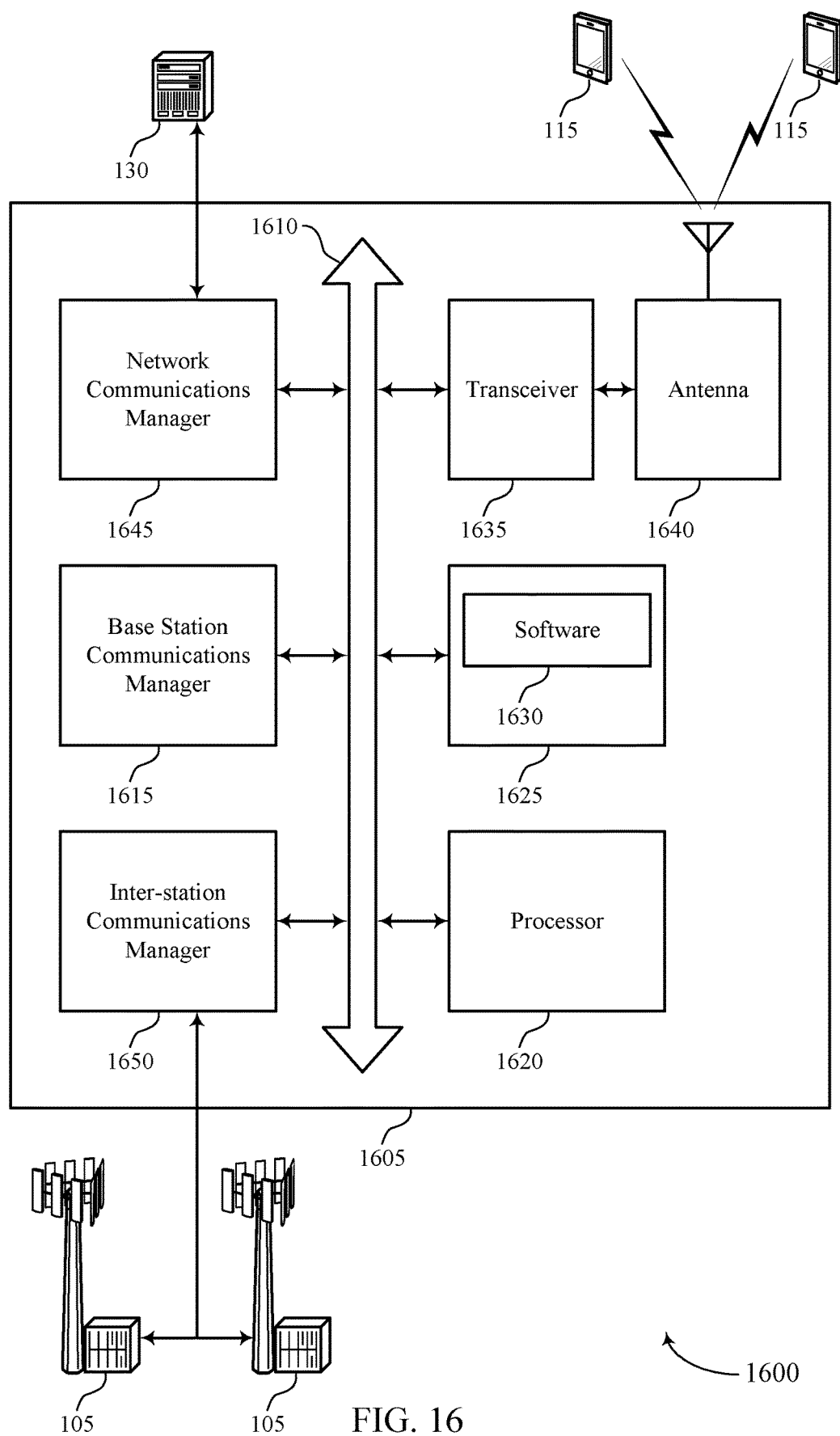
FIG. 16 illustrates a block diagram of a system including a base station that supports polar code techniques in accordance with aspects of the present disclosure.

FIG. 16 shows a diagram of a system 1600 including a device 1605 that supports polar code techniques in accordance with aspects of the present disclosure. Device 1605 may be an example of or include the components of base station 105 as described above, e.g., with reference to FIG. 1. Device 1605 may include components for bi-directional voice and data communications including components for transmitting and receiving communications, including base station communications manager 1615, processor 1620, memory 1625, software 1630, transceiver 1635, antenna 1640, network communications manager 1645, and inter-station communications manager 1650. These components may be in electronic communication via one or more buses (e.g., bus 1610). Device 1605 may communicate wirelessly with one or more UEs 115.

Processor 1620 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some aspects, processor 1620 may be configured to operate a memory array using a memory controller. In other aspects, a memory controller may be integrated into processor 1620. Processor 1620 may be configured to execute computer-readable instructions stored in a memory to perform various functions (e.g., functions or tasks supporting polar codes with a cross-referenceable nested structure for hierarchical signaling).

Memory 1625 may include RAM and ROM. The memory 1625 may store computer-readable, computer-executable software 1630 including instructions that, when executed, cause the processor to perform various functions described herein. In some aspects, the memory 1625 may contain, among other things, a BIOS that may control basic hardware or software operation such as the interaction with peripheral components or devices.

Software 1630 may include code to implement aspects of the present disclosure, including code to support polar codes with a cross-referenceable nested structure for hierarchical signaling. Software 1630 may be stored in a non-transitory computer-readable medium such as system memory or other memory. In some aspects, the software 1630 may not be directly executable by the processor but may cause a computer (e.g., when compiled and executed) to perform functions described herein.

Transceiver 1635 may communicate bi-directionally, via one or more antennas, wired, or wireless links as described above. For example, the transceiver 1635 may represent a wireless transceiver and may communicate bi-directionally with another wireless transceiver. The transceiver 1635 may also include a modem to modulate the packets and provide the modulated packets to the antennas for transmission, and to demodulate packets received from the antennas.

In some aspects, the wireless device may include a single antenna 1640. However, in some aspects the device may have more than one antenna 1640 that may be capable of concurrently transmitting or receiving multiple wireless transmissions.

Network communications manager 1645 may manage communications with the core network (e.g., via one or more wired backhaul links). For example, the network communications manager 1645 may manage the transfer of data communications for client devices, such as one or more UEs 115.

Inter-station communications manager 1650 may manage communications with other base station 105, and may include a controller or scheduler for controlling communications with UEs 115 in cooperation with other base stations 105. For example, the inter-station communications manager 1650 may coordinate scheduling for transmissions to UEs 115 for various interference mitigation techniques such as beamforming or joint transmission. In some examples, inter-station communications manager 1650 may provide an X2 interface within an Long Term Evolution (LTE)/LTE-A wireless communication network technology to provide communication between base stations 105.

Figure 17:
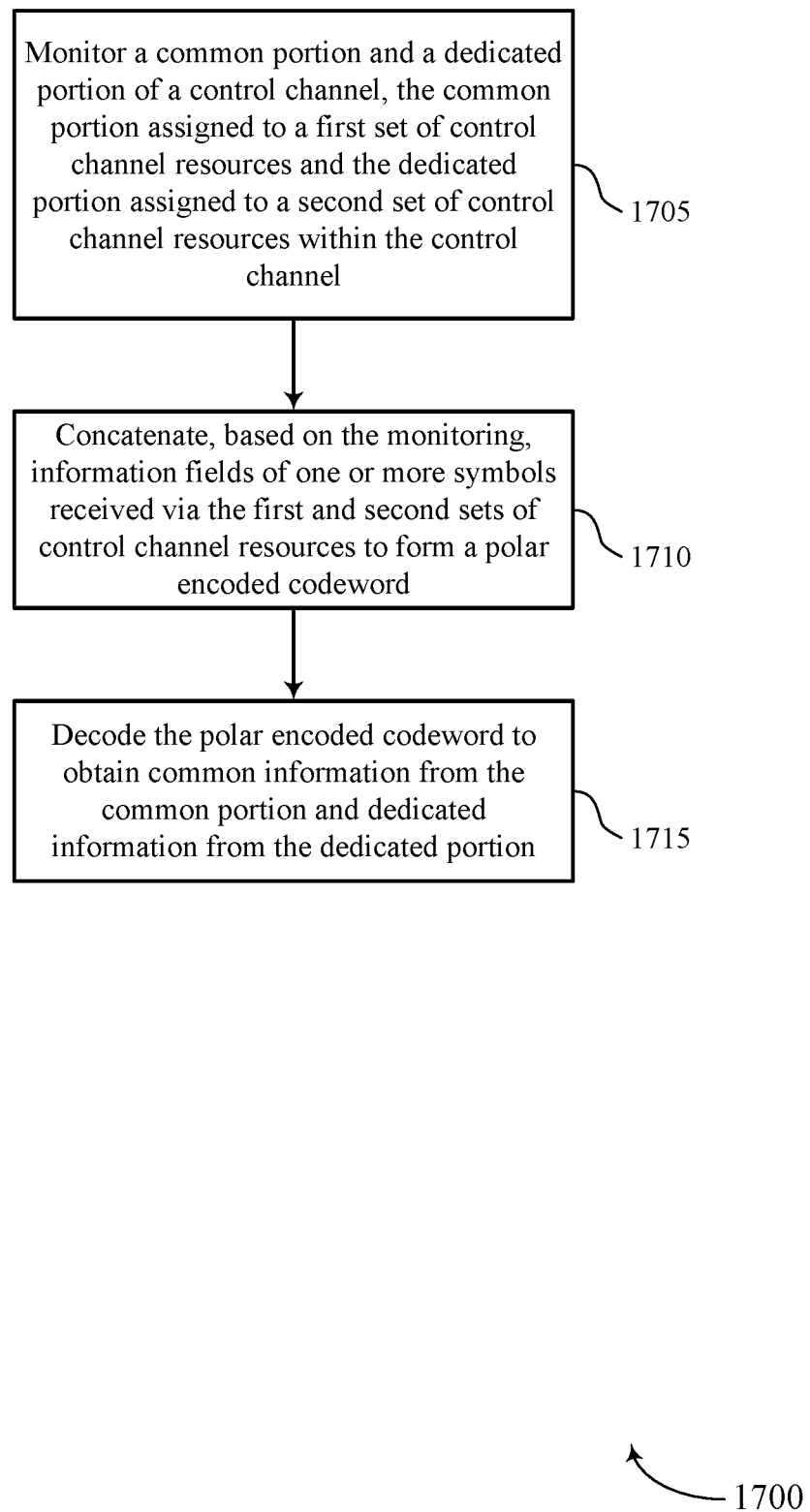
FIGS. 17 through 20 illustrate methods for polar code techniques in accordance with aspects of the present disclosure.

FIG. 17 shows a flowchart illustrating a method 1700 for polar code techniques in accordance with aspects of the present disclosure. The operations of method 1700 may be implemented by a UE 115 or its components as described herein. For example, the operations of method 1700 may be performed by a UE communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1705 the UE 115 may monitor a common portion and a dedicated portion of a control channel, the common portion assigned to a first set of control channel resources and the dedicated portion assigned to a second set of control channel resources within the control channel. The operations of block 1705 may be performed according to the methods described herein. In certain examples, aspects of the operations of block 1705 may be performed by a monitor component as described with reference to FIGS. 9 through 12.

At block 1710 the UE 115 may concatenate, based at least in part on the monitoring, information fields of one or more symbols received via the first and second sets of control channel resources to form a polar-encoded codeword. The operations of block 1710 may be performed according to the methods described herein. In certain examples, aspects of the operations of block 1710 may be performed by a concatenator as described with reference to FIGS. 9 through 12.

At block 1715 the UE 115 may decode the polar-encoded codeword to obtain common information from the common portion and dedicated information from the dedicated portion. The operations of block 1715 may be performed according to the methods described herein. In certain examples, aspects of the operations of block 1715 may be performed by a polar decoder as described with reference to FIGS. 9 through 12.

Figure 18:
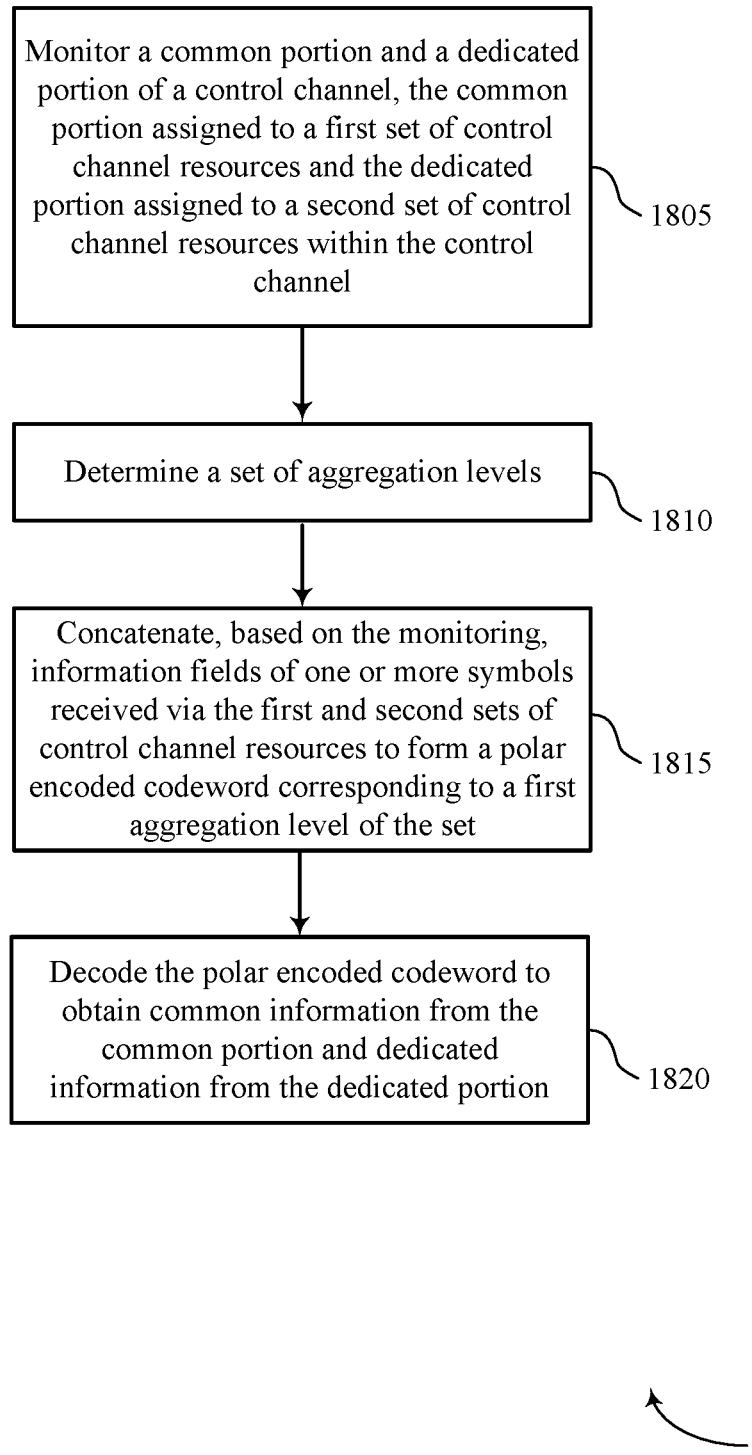

FIG. 18 shows a flowchart illustrating a method 1800 for polar code techniques in accordance with aspects of the present disclosure. The operations of method 1800 may be implemented by a UE 115 or its components as described herein. For example, the operations of method 1800 may be performed by a UE communications manager as described with reference to FIGS. 9 through 12. In some examples, a UE 115 may execute a set of codes to control the functional elements of the device to perform the functions described below. Additionally or alternatively, the UE 115 may perform aspects of the functions described below using special-purpose hardware.

At block 1805 the UE 115 may monitor a common portion and a dedicated portion of a control channel, the common portion assigned to a first set of control channel resources and the dedicated portion assigned to a second set of control channel resources within the control channel. The operations of block 1805 may be performed according to the methods described herein. In certain examples, aspects of the operations of block 1805 may be performed by a monitor component as described with reference to FIGS. 9 through 12.

At block 1810 the UE 115 may determine a set of aggregation levels. The operations of block 1805 may be performed according to the methods described herein. In certain examples, aspects of the operations of block 1810 may be performed by an aggregation level determiner as described with reference to FIGS. 9 through 12.

At block 1815 the UE 115 may concatenate, based at least in part on the monitoring, information fields of one or more symbols received via the first and second sets of control channel resources to form a polar-encoded codeword corresponding to a first aggregation level of the set of aggregation levels. The operations of block 1815 may be performed according to the methods described herein. In certain examples, aspects of the operations of block 1815 may be performed by a concatenator as described with reference to FIGS. 9 through 12.

At block 1820 the UE 115 may decode the polar-encoded codeword to obtain common information from the common portion and dedicated information from the dedicated portion. The operations of block 1815 may be performed according to the methods described herein. In certain examples, aspects of the operations of block 1820 may be performed by a polar decoder as described with reference to FIGS. 9 through 12.

Figure 19:
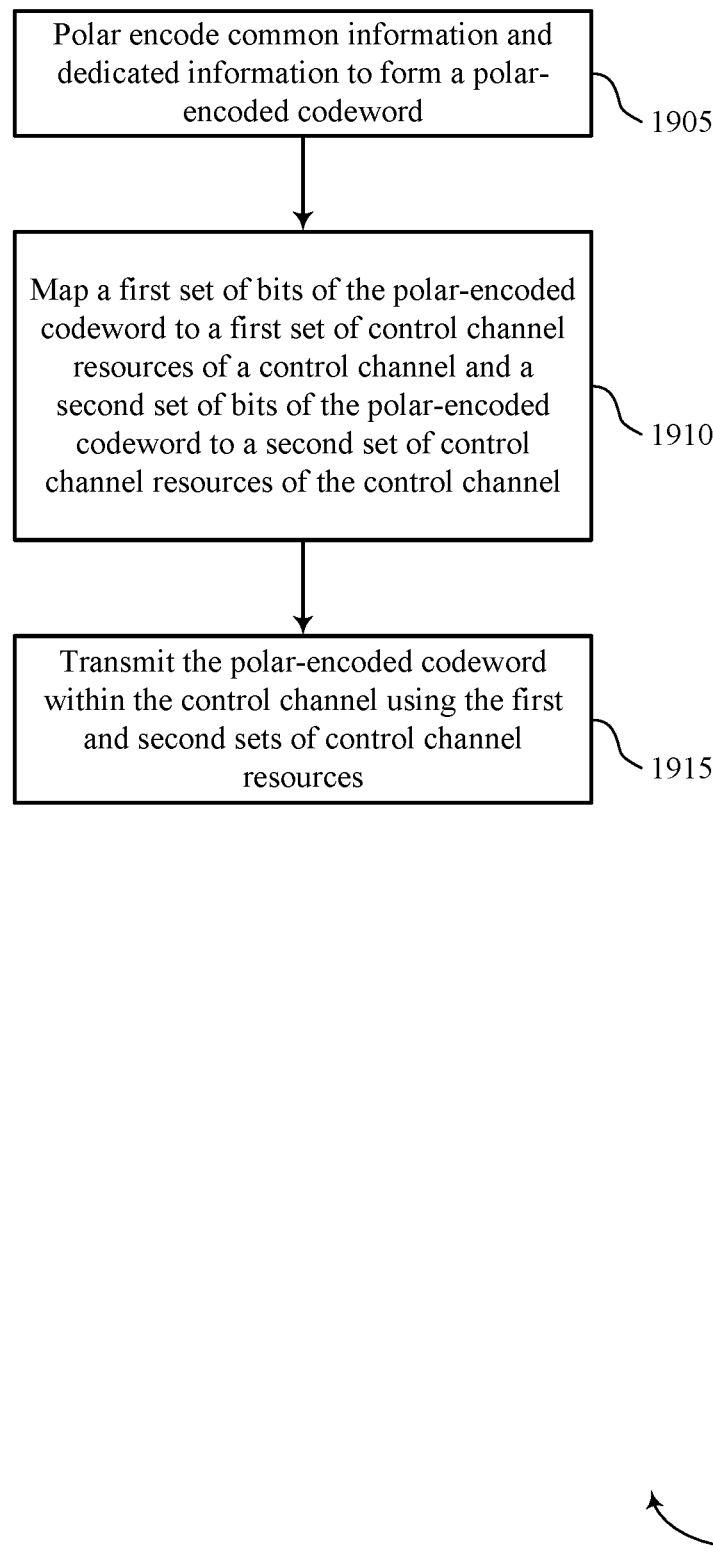

FIG. 19 shows a flowchart illustrating a method 1900 for polar code techniques in accordance with aspects of the present disclosure. The operations of method 1900 may be implemented by a base station 105 or its components as described herein. For example, the operations of method 1900 may be performed by a base station communications manager as described with reference to FIGS. 13 through 16. In some examples, a base station 105 may execute a set of codes to control the functional elements of the device to perform the functions described below. Additionally or alternatively, the base station 105 may perform aspects of the functions described below using special-purpose hardware.

At block 1905 the base station 105 may polar encoding common information and dedicated information to form a polar-encoded codeword. The operations of block 1905 may be performed according to the methods described herein. In certain examples, aspects of the operations of block 1905 may be performed by a polar encoder as described with reference to FIGS. 13 through 16.

At block 1910 the base station 105 may map a first set of bits of the polar-encoded codeword to a first set of control channel resources of a control channel and a second set of bits of the polar-encoded codeword to a second set of control channel resources of the control channel. The operations of block 1910 may be performed according to the methods described herein. In certain examples, aspects of the operations of block 1910 may be performed by a mapper as described with reference to FIGS. 13 through 16.

At block 1915 the base station 105 may transmit the polar-encoded codeword within the control channel using the first and second sets of control channel resources. The operations of block 1915 may be performed according to the methods described herein. In certain examples, aspects of the operations of block 1915 may be performed by a modulator as described with reference to FIGS. 13 through 16.

Figure 20:
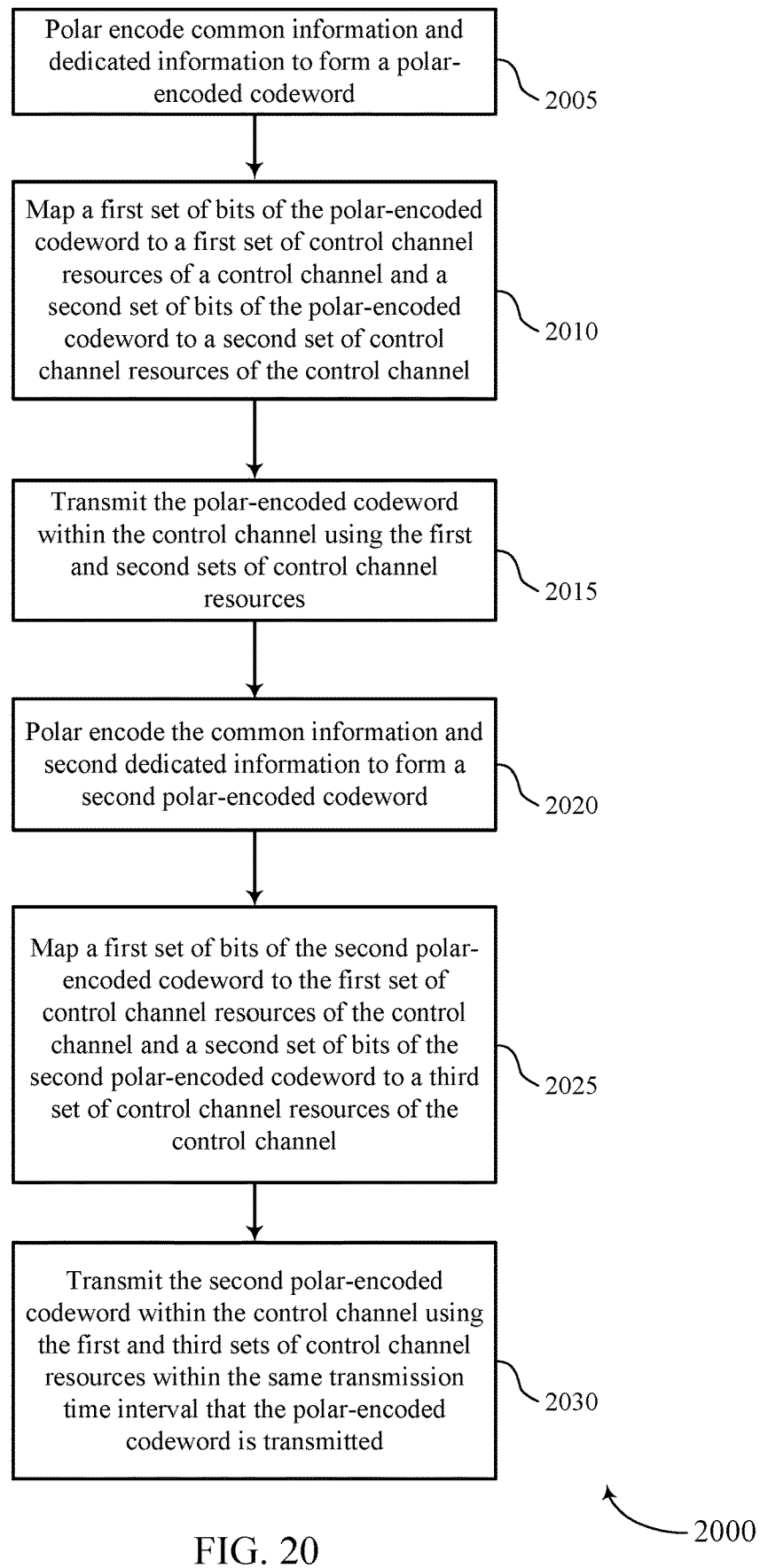

FIG. 20 shows a flowchart illustrating a method 2000 for polar code techniques in accordance with aspects of the present disclosure. The operations of method 2000 may be implemented by a base station 105 or its components as described herein. For example, the operations of method 2000 may be performed by a base station communications manager as described with reference to FIGS. 13 through 16. In some examples, a base station 105 may execute a set of codes to control the functional elements of the device to perform the functions described below. Additionally or alternatively, the base station 105 may perform aspects of the functions described below using special-purpose hardware.

At block 2005 the base station 105 may polar encode common information and dedicated information to form a polar-encoded codeword. The operations of block 2005 may be performed according to the methods described herein. In certain examples, aspects of the operations of block 2005 may be performed by a polar encoder as described with reference to FIGS. 13 through 16.

At block 2010 the base station 105 may map a first set of bits of the polar-encoded codeword to a first set of control channel resources of a control channel and a second set of bits of the polar-encoded codeword to a second set of control channel resources of the control channel. The operations of block 2010 may be performed according to the methods described herein. In certain examples, aspects of the operations of block 2010 may be performed by a mapper as described with reference to FIGS. 13 through 16.

At block 2015 the base station 105 may transmit the polar-encoded codeword within the control channel using the first and second sets of control channel resources. The operations of block 2015 may be performed according to the methods described herein. In certain examples, aspects of the operations of block 2015 may be performed by a modulator as described with reference to FIGS. 13 through 16.

At block 2020 the base station 105 may polar encode the common information and second dedicated information to form a second polar-encoded codeword, wherein the dedicated information is specific to a first UE, the second dedicated information is specific to a second UE, and the common information is common to the first and second UEs. The operations of block 2020 may be performed according to the methods described herein. In certain examples, aspects of the operations of block 2020 may be performed by a polar encoder as described with reference to FIGS. 13 through 16.

At block 2025 the base station 105 may map a first set of bits of the second polar-encoded codeword to the first set of control channel resources of the control channel and a second set of bits of the second polar-encoded codeword to a third set of control channel resources of the control channel. The operations of block 2025 may be performed according to the methods described herein. In certain examples, aspects of the operations of block 2025 may be performed by a mapper as described with reference to FIGS. 13 through 16.

At block 2030 the base station 105 may transmit the second polar-encoded codeword within the control channel using the first and third sets of control channel resources within the same transmission time interval that the polar-encoded codeword is transmitted. The operations of block 2030 may be performed according to the methods described herein. In certain examples, aspects of the operations of block 2030 may be performed by a modulator as described with reference to FIGS. 13 through 16.

It should be noted that the methods described above describe possible implementations, and that the operations may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1X, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary operation that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
   monitoring a common portion, a dedicated portion, and a group portion of a control channel, the common portion assigned to a first set of control channel resources, the dedicated portion assigned to a second set of control channel resources, and the group portion assigned to a third set of control channel resources within the control channel;
   concatenating, based at least in part on the monitoring, information fields of one or more symbols received via the first, second, and third sets of control channel resources to form a polar-encoded codeword; and
   decoding the polar-encoded codeword to obtain common information from the common portion, dedicated information from the dedicated portion, and group information from the group portion.

2. The method of claim 1, wherein decoding the polar-encoded codeword comprises:
   determining a set of aggregation levels, wherein concatenating the information fields of one or more symbols received via the first, second, and third sets of control channel resources to form the polar-encoded codeword corresponds to a first aggregation level within the set of aggregation levels.

3. The method of claim 2, wherein:
each of the aggregation levels includes a same number of bits for the common information and the same or a different number of bits for the dedicated information.

4. The method of claim 1, wherein concatenating the information fields of one or more symbols received via the first, second, and third sets of control channel resources to form the polar-encoded codeword comprises:
performing de-rate matching to form the polar-encoded codeword.

5. The method of claim 1, wherein decoding the polar-encoded codeword comprises:
obtaining at least one error detection code (EDC) value from the polar-encoded codeword; and
determining whether the common information, the dedicated information, or both, pass error detection based at least in part on the at least one EDC value.

6. The method of claim 5, wherein:
the at least one EDC value is in the dedicated information.

7. The method of claim 1, wherein the polar-encoded codeword is generated by an encoder comprising a plurality of encoding branches, wherein the plurality of encoding branches are divided into at least a first encoding branch subset and a second encoding branch subset, outputs of the first encoding branch subset being independent of inputs to the second encoding branch subset, and wherein the encoder encodes the common information using the first encoding branch subset and the dedicated information using the second encoding branch sub set.

8. The method of claim 1, wherein:
the common information is control information for a plurality of user equipments (UEs).

9. The method of claim 1, wherein:
the dedicated information is control information specific to a user equipment (UE).

10. The method of claim 1, wherein:
each of the first and second sets of control channel resources is a different set of sub-carriers of the control channel.

11. A method for wireless communication, comprising:
polar encoding common information, dedicated information, and group information to form a polar-encoded codeword;
mapping a first set of bits of the polar-encoded codeword to a first set of control channel resources of a control channel, a second set of bits of the polar-encoded codeword to a second set of control channel resources of the control channel, and a third set of bits of the polar-encoded codeword to a third set of control channel resources within the control channel; and
transmitting the polar-encoded codeword within the control channel using the first, second, and third sets of control channel resources.

12. The method of claim 11, further comprising:
polar encoding the common information and second dedicated information to form a second polar-encoded codeword, wherein the dedicated information is specific to a first user equipment (UE), the second dedicated information is specific to a second UE, and the common information is common to the first and second UEs;
mapping a first set of bits of the second polar-encoded codeword to the first set of control channel resources of the control channel and a second set of bits of the second polar-encoded codeword to a fourth set of control channel resources of the control channel; and
transmitting the second polar-encoded codeword within the control channel using the first and fourth sets of control channel resources within the same transmission time interval that the polar-encoded codeword is transmitted.

13. The method of claim 11, further comprising:
generating at least one error detection code (EDC) value based at least in part on the common information, the dedicated information, or both, wherein the polar encoding comprises polar encoding the common information, the dedicated information, and the at least one EDC value to form the polar-encoded codeword.

14. The method of claim 11, further comprising:
selecting an aggregation level from a plurality of aggregation levels, wherein the mapping of the second set of bits of the polar-encoded codeword to the second set of control channel resources of the control channel is based at least in part on the selected aggregation level.

15. The method of claim 14, further comprising:
determining a power level for the first set of bits of the polar-encoded codeword based at least in part on the selected aggregation level, wherein the transmitting of the polar-encoded codeword within the control channel is based at least in part on the determined power level.

16. The method of claim 11, further comprising:
performing rate matching on the polar-encoded codeword to generate a rate-matched polar-encoded codeword, wherein the transmitting comprises transmitting the rate-matched polar-encoded codeword.

17. The method of claim 11, wherein:
the polar encoding is performed by an encoder comprising a plurality of encoding branches, wherein the plurality of encoding branches are divided into at least a first encoding branch subset and a second encoding branch subset, outputs of the first encoding branch subset being independent of inputs to the second encoding branch subset, and wherein the encoder encodes the common information using the first encoding branch subset and the dedicated information using the second encoding branch subset.

18. The method of claim 11, wherein:
each of the first and second sets of control channel resources is a different set of sub-carriers within the control channel.

19. An apparatus for wireless communication, comprising:
a receiver;
a processor;
memory in electronic communication with the processor; and
instructions stored in the memory and operable, when executed by the processor, to cause the apparatus to:
monitor, via the receiver, a common portion, a dedicated portion, and a group portion of a control channel, the common portion assigned to a first set of control channel resources, the dedicated portion assigned to a second set of control channel resources, and the group portion assigned to a third set of control channel resources within the control channel;
concatenate, based at least in part on the monitoring, information fields of one or more symbols received via the first, second, and third sets of control channel resources to form a polar-encoded codeword; and
decode the polar-encoded codeword to obtain common information from the common portion, dedicated information from the dedicated portion, and group information from the group portion.

20. The apparatus of claim 19, wherein decoding the polar-encoded codeword comprises instructions further executable by the processor to:
determine a set of aggregation levels, wherein concatenating the information fields of one or more symbols received via the first, second, and third sets of control channel resources to form the polar-encoded codeword corresponds to a first aggregation level within the set of aggregation levels.

21. The apparatus of claim 20, wherein:
each of the aggregation levels includes a same number of bits for the common information and the same or a different number of bits for the dedicated information.

22. The apparatus of claim 19, wherein concatenating the information fields of one or more symbols received via the first, second, and third sets of control channel resources to form the polar-encoded codeword comprises instructions further executable by the processor to:
perform de-rate matching to form the polar-encoded codeword.

23. The apparatus of claim 19, wherein decoding the polar-encoded codeword comprises instructions further executable by the processor to:
obtain at least one error detection code (EDC) value from the polar-encoded codeword; and
determine whether the common information, the dedicated information, or both, pass error detection based at least in part on the at least one EDC value.

24. The apparatus of claim 23, wherein:
the at least one EDC value is in the dedicated inform.

25. The apparatus of claim 19, further comprising:
an encoder comprising a plurality of encoding branches, wherein the plurality of encoding branches are divided into at least a first encoding branch subset and a second encoding branch subset, outputs of the first encoding branch subset being independent of inputs to the second encoding branch subset, and
wherein the instructions are further executable by the processor to cause the encoder to encode the common information using the first encoding branch subset and the dedicated information using the second encoding branch subset.

26. The apparatus of claim 19, wherein:
the common information is control information for a plurality of user equipments (UEs).

27. The apparatus of claim 19, wherein:
the dedicated information is control information specific to the apparatus.

28. The apparatus of claim 19, wherein:
each of the first and second sets of control channel resources is a different set of sub-carriers of the control channel.

29. An apparatus for wireless communication, comprising:
a transmitter;
a processor;
memory in electronic communication with the processor; and
instructions stored in the memory and operable, when executed by the processor, to cause the apparatus to:
polar encode common information, dedicated information, and group information to form a polar-encoded codeword;
map a first set of bits of the polar-encoded codeword to a first set of control channel resources of a control channel, a second set of bits of the polar-encoded codeword to a second set of control channel resources of the control channel, and a third set of bits of the polar-encoded codeword to a third set of control channel resources within the control channel; and
transmit, via the transmitter, the polar-encoded codeword within the control channel using the first, second, and third sets of control channel resources.

30. The apparatus of claim 29, wherein the instructions are further executable by the processor to:
polar encode the common information and second dedicated information to form a second polar-encoded codeword, wherein the dedicated information is specific to a first user equipment (UE), the second dedicated information is specific to a second UE, and the common information is common to the first and second UEs;
map a first set of bits of the second polar-encoded codeword to the first set of control channel resources of the control channel and a second set of bits of the second polar-encoded codeword to a fourth set of control channel resources of the control channel; and
transmit the second polar-encoded codeword within the control channel using the first and fourth sets of control channel resources within the same transmission time interval that the polar-encoded codeword is transmitted.

31. The apparatus of claim 29, wherein the instructions are further executable by the processor to:
generate at least one error detection code (EDC) value based at least in part on the common information, the dedicated information, or both, wherein the polar encoding comprises instructions further executable by the processor to:
polar encode the common information, the dedicated information, and the at least one EDC value to form the polar-encoded codeword.

32. The apparatus of claim 29, wherein the instructions are further executable by the processor to:
select an aggregation level from a plurality of aggregation levels, wherein the mapping of the second set of bits of the polar-encoded codeword to the second set of control channel resources of the control channel is based at least in part on the selected aggregation level.

33. The apparatus of claim 32, wherein the instructions are further executable by the processor to:
determine a power level for the first set of bits of the polar-encoded codeword based at least in part on the selected aggregation level, wherein the transmitting of the polar-encoded codeword within the control channel is based at least in part on the determined power level.

34. The apparatus of claim 29, wherein the instructions are further executable by the processor to:
perform rate matching on the polar-encoded codeword to generate a rate-matched polar-encoded codeword, wherein the transmitting comprises transmitting the rate-matched polar-encoded codeword.

35. The apparatus of claim 29, further comprising:
an encoder comprising a plurality of encoding branches, wherein the plurality of encoding branches are divided into at least a first encoding branch subset and a second encoding branch subset, outputs of the first encoding branch subset being independent of inputs to the second encoding branch subset, and
wherein the instructions are further executable by the processor to cause the encoder to encode the common information using the first encoding branch subset and the dedicated information using the second encoding branch subset.

36. The apparatus of claim 29, wherein:
each of the first and second sets of control channel resources is a different set of sub-carriers within the control channel.

37. An apparatus for wireless communication, comprising:
means for monitoring a common portion, a dedicated portion, and a group portion of a control channel, the common portion assigned to a first set of control channel resources, the dedicated portion assigned to a second set of control channel resources, and the group portion assigned to a third set of control channel resources within the control channel;
means for concatenating, based at least in part on the monitoring, information fields of one or more symbols received via the first, second, and third sets of control channel resources to form a polar-encoded codeword; and
means for decoding the polar-encoded codeword to obtain common information from the common portion, dedicated information from the dedicated portion, and group information from the group portion.

38. An apparatus for wireless communication, comprising:
means for polar encoding common information, dedicated information, and group information to form a polar-encoded codeword;
means for mapping a first set of bits of the polar-encoded codeword to a first set of control channel resources of a control channel, a second set of bits of the polar-encoded codeword to a second set of control channel resources of the control channel, and a third set of bits of the polar-encoded codeword to a third set of control channel resources within the control channel; and
means for transmitting the polar-encoded codeword within the control channel using the first, second, and third sets of control channel resources.

39. A non-transitory computer readable medium storing code for wireless communication, the code comprising instructions executable by a processor to:
monitor a common portion, a dedicated portion, and a group portion of a control channel, the common portion assigned to a first set of control channel resources, the dedicated portion assigned to a second set of control channel resources, and the group portion assigned to a third set of control channel resources within the control channel;
concatenate, based at least in part on the monitoring, information fields of one or more symbols received via the first, second, and third sets of control channel resources to form a polar-encoded codeword; and
decode the polar-encoded codeword to obtain common information from the common portion, dedicated information from the dedicated portion, and group information from the group portion.

40. A non-transitory computer readable medium storing code for wireless communication, the code comprising instructions executable by a processor to:
polar encoding common information, dedicated information, and group information to form a polar-encoded codeword;
map a first set of bits of the polar-encoded codeword to a first set of control channel resources of a control channel, a second set of bits of the polar-encoded codeword to a second set of control channel resources of the control channel, and a third set of bits of the polar-encoded codeword to a third set of control channel resources within the control channel; and
transmit the polar-encoded codeword within the control channel using the first, second, and third sets of control channel resources.

* * * * *